(12) United States Patent
Hayashi

(10) Patent No.: US 8,288,939 B2
(45) Date of Patent: *Oct. 16, 2012

(54) PHOTOELECTRIC CONVERSION ELEMENT, METHOD FOR PRODUCING PHOTOELECTRIC CONVERSION ELEMENT, AND SOLID-STATE IMAGING DEVICE

(75) Inventor: Masayuki Hayashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 30 days.

This patent is subject to a terminal disclaimer.

(21) Appl. No.: 12/953,179

(22) Filed: Nov. 23, 2010

(65) Prior Publication Data

US 2011/0068254 A1 Mar. 24, 2011

Related U.S. Application Data

(63) Continuation of application No. 12/195,213, filed on Aug. 20, 2008, now Pat. No. 7,863,605.

(30) Foreign Application Priority Data

Aug. 22, 2007 (JP) ................................. 2007-215715

(51) Int. Cl.
*H01L 51/00* (2006.01)
(52) U.S. Cl. ......................................... 313/504; 257/40

(58) Field of Classification Search .................. 136/243; 257/40, 94, 96; 313/503, 504, 506
See application file for complete search history.

(56) References Cited

U.S. PATENT DOCUMENTS

| 2004/0056180 A1 | 3/2004 | Yu |
| 2005/0205958 A1 | 9/2005 | Taniguchi et al. |
| 2005/0224905 A1 | 10/2005 | Forrest et al. |
| 2006/0027834 A1 | 2/2006 | Forrest et al. |
| 2008/0116536 A1 | 5/2008 | Forrest et al. |

FOREIGN PATENT DOCUMENTS

| JP | 9-74216 A | 3/1997 |
| JP | 2004-165474 A | 6/2004 |
| JP | 2005-268609 A | 9/2005 |
| JP | 2007-123707 A | 5/2007 |

OTHER PUBLICATIONS

Office Action dated May 31, 2011 in Japanese Patent Application No. 2007-215715.

*Primary Examiner* — Thomas L Dickey
(74) *Attorney, Agent, or Firm* — Sughrue Mion, PLLC

(57) ABSTRACT

A photoelectric conversion element is provided and includes a photoelectric conversion portion. The photoelectric conversion portion includes: a pair of electrodes; and a photoelectric conversion layer between the pair of electrodes, and at least part of the photoelectric conversion layer includes a mixed layer of a p-type organic semiconductor and a fullerene, and a mixing ratio of the fullerene to the p-type organic semiconductor in terms of thickness ratio is less than 1:1.

20 Claims, 9 Drawing Sheets

PHOTOELECTRIC CONVERSION ELEMENT, METHOD FOR PRODUCING PHOTOELECTRIC CONVERSION ELEMENT, AND SOLID-STATE IMAGING DEVICE

CROSS REFERENCE TO RELATED APPLICATIONS

This is a continuation application of U.S. application Ser. No. 12/195,213 filed Aug. 20, 2008, which is based on and claims priority under 35 U.S.C. §119 from Japanese Patent Application No. 2007-215715 filed Aug. 22, 2007, the entire disclosures of which are herein incorporated by reference.

BACKGROUND OF THE INVENTION

1. Field of the Invention

The present invention relates to a photoelectric conversion element including: a lower electrode; an upper electrode opposite to the lower electrode; and an organic photoelectric conversion layer formed between the lower electrode and the upper electrode, a method for producing the photoelectric conversion element, and a solid-state imaging device.

2. Description of Related Art

Photosensors are generally devices prepared by forming a photodiode (PD) in a semiconductor substrate such as silicon (Si) and, as a solid-state imaging device, a plane type solid-state imaging device is widely used in which PDs are two-dimensionally arranged in a semiconductor substrate, and signals each corresponding to a signal charge generated in each PD by photoelectric conversion are read out by CCD or CMOS circuit. As a technique for realizing a color solid-state imaging device, a structure in which color filters each transmitting only light in a particular wavelength are arranged for color separation on the light-incident side of the plane type solid-state imaging device is general. In particular, as a system at present widely used in, for example digital cameras, a single plate solid-state imaging device is well known in which color filters each transmitting blue (B) light, green (G) light, or red (R) light are regularly arranged on the two-dimensionally arranged respective PDs.

However, in the single plate solid-state imaging device, each of the color filters transmits only light in a particular wavelength and light not transmitting through the color filter is not utilized, and thus light utilization efficiency is not good. Also, with the increase in degree of integration, the size of PD becomes about the same size as the wavelength of light, and it becomes difficult for the light to be wave-guided to PD. Also, since color reproduction is conducted by detecting blue light, green light, and red light by means of individual neighboring PDs and calculation-processing the data, there can result formation of a false color. In order to avoid this formation of false color, an optical low-pass filter is required, and there arises light loss due to the filter.

As a device for solving the above matters, there has been reported a color sensor in which utilizing the dependency of the absorption coefficient of silicon on the wavelength, three PDs are stacked in a silicon substrate and color separation is performed based on depth difference of the pn junction plane of each PD. In this system, however, the dependency on wavelength of spectral sensitivity with each of the stacked PDs is so broad that there results insufficient color separation. In particular, color separation between blue color and green color is insufficient.

In order to solve this matter, there has been proposed a stacked-type imaging device in which an organic photoelectric conversion element detecting green light to generate a signal charge in proportion to the detected green light is provided above a silicon substrate, whereas two PDs stacked in the silicon substrate detect blue light and red light, respectively. The organic photoelectric conversion element provided above the silicon substrate includes a lower electrode stacked above the silicon substrate, an organic photoelectric conversion layer composed of an organic material and stacked on the lower electrode, and an upper electrode stacked on the organic photoelectric conversion layer and is constituted so that, when a voltage is applied across the lower electrode and the upper electrode, the signal charge generated in the organic photoelectric conversion layer moves to the lower electrode or to the upper electrode, and that a signal corresponding to the signal charge moved to either of the electrode is read out by CCD or CMOS circuit provided in the silicon substrate.

With photoelectric conversion elements in the related art, there has been described a technique of stacking or mixing a fullerene in order to enhance photoelectric conversion efficiency. See, for example, JP-A-9-74216, JP-A-2004-165474, and JP-A-2007-123707.

However, with such photoelectric conversion elements in the related art, the photoelectric conversion efficiency is truly improved by the technique of stacking or mixing a fullerene for enhancing the photoelectric conversion efficiency, but the dark current is also increased, which results in that a sufficient photo current/dark current ratio is unable to be obtained. This increase in dark current does not matter with organic solar cells, or the like, but is a fatal defect with such applications as organic imaging devices and organic image scanners which require a low dark current. Thus, it has been difficult to use the above-described technique for such applications. In addition, since the absorption spectrum of a fullerene is so broad that, in the point of not only the dark current but absorption spectrum as well, it has been difficult to use a fullerene for the photoelectric conversion layer of an imaging device or a visible light-transmitting photoelectric conversion element having photoelectric conversion sensitivity to infrared region.

With organic photoelectric conversion elements in the related art in which fullerene is used in the photoelectric conversion layer, optimization of the element structure has been conducted for the purpose of maximally enhancing the efficiency. For example, it has been reported that, with respect to the structure of photoelectric conversion layer, the structure in which the film thickness ratio of an n-type organic semiconductor of fullerene to a p-type organic semiconductor of copper phthalocyanine is about 1:1 provides the highest efficiency as a solar cell (for example, Appl. Phys. Lett., Vol. 84, p 4218). However, most of the investigations relate to solar cells, and there have been no reports on improvement of the photo current/dark current ratio which is necessary for an imaging device.

Also, with solar cells, a structure is required in which the short-circuit current value in a non-biased situation upon irradiation with light, the leak current value upon application of bias, and a fill factor are maximized. However, dark current other than leak current does not particularly cause problems. For example, a dark current of about several $\mu A/cm^2$ may be acceptable. On the other hand, imaging devices and image scanners are required to provide a large photo current and a small dark current upon application of bias. For example, in the case of photographing in the dark room, the photo current is at such a low level that the imaging device is required to provide a much lower dark current. Thus, it is required to suppress the dark current at a level of at most several $nA/cm^2$ and, if possible, at a level of from about several hundred $pA/cm^2$ to about several $pA/cm^2$. For example, in the case of applying a bias of several volts to an organic photoelectric conversion element optimized to the application of solar cells, the dark current is as large as several ten µA/cm$^2$ though the efficiency is truly high, and hence the element is unable to be used as an imaging device. Also, in the case where the bias to be applied is reduced to a certain level or to zero in order to suppress the dark current, there results insufficient efficiency, thus the element being unable to be used as an imaging device.

Further, as is different from solar cells which are required to absorb visible light of a wavelength region as broad as possible and conduct photoelectric conversion for taking out energy, imaging devices are required to have a sharp absorption spectrum. For example, they are required to have a sharp spectral sensitivity of about 100 nm in half-wave value and, for example, to absorb only blue light having a peak in the range of from 400 nm to 500 nm, only green light having a peak in the range of from 500 nm to 600 nm, only red light having a peak in the range of from 600 nm to 700 nm, or only near infrared light with transmitting the entire visible light. However, since fullerene has a wide absorption spectrum in the visible range, it is difficult to obtain a sharp spectral sensitivity necessary for an imaging device by forming a photoelectric conversion layer in which fullerene and a p-type organic semiconductor are stacked with a film thickness ratio of about 1:1.

SUMMARY OF THE INVENTION

An object of the invention is to provide a photoelectric conversion element, which can improve the photoelectric conversion efficiency with suppressing generation of dark current; a method for producing the photoelectric conversion element, and a solid-state imaging device.

As is described above, it has been difficult to apply the technique of improving photoelectric conversion efficiency by using fullerene, which has been examined with solar cells, as such to the imaging device, and further investigations are required. Thus, as a result of various investigations, the inventors have found that by sufficiently reducing the mixing ratio of fullerene, both improvement of the efficiency by fullerene and reduction of dark current can be attained at the same time to thereby obtain a sufficient photo current/dark current ratio. It has usually been considered that, when the mixing ratio of fullerene is reduced, there results a reduced effect of improving the efficiency. However, it has now been found that, when a voltage is applied from outside, surprisingly enough, the effect is not reduced so much, while the dark current is remarkably reduced. As a result, an imaging device can be provided with an enough photo current/dark current ratio.

Also, the broad absorption spectrum due to fullerene can be narrowed by reducing the mixing ratio of fullerene, and thus it becomes possible to apply the element to an imaging device.

The above-described object of the invention can be attained by the following means.
(1) A photoelectric conversion element comprising a photoelectric conversion portion, the photoelectric conversion portion including: a pair of electrodes; and a photoelectric conversion layer between the pair of electrodes, wherein at least part of the photoelectric conversion layer includes a mixed layer of a p-type organic semiconductor and a fullerene, and a mixing ratio of the fullerene to the p-type organic semiconductor in terms of thickness ratio is less than 1:1.
(2) The photoelectric conversion element as described in (1) above, wherein the photoelectric conversion portion further includes a first charge-blocking layer between one of the pair of electrodes and the photoelectric conversion layer, the first charge-blocking layer suppressing injection of a charge from the one of the pair of electrodes into the photoelectric conversion layer upon applying a voltage across the pair of electrodes.
(3) The photoelectric conversion element as described in (2) above, wherein the photoelectric conversion portion further includes a second charge-blocking layer between the other of the pair of electrodes and the photoelectric conversion layer, the second charge-blocking layer suppressing injection of a charge from the other of the pair of electrodes into the photoelectric conversion layer upon applying a voltage across the pair of electrodes.
(4) The photoelectric conversion element as described in any one of (1) to (3) above, wherein a value obtained by dividing a voltage externally applied across the pair of electrodes by the distance between the pair of electrodes is from $1.0 \times 10^5$ V/cm to $1.0 \times 10^7$ V/cm.
(5) The photoelectric conversion element as described in any one of (1) to (4) above, wherein the fullerene is one of fullerene C60 and fullerene C70.
(6) The photoelectric conversion element as described in any one of (1) to (4) above, wherein the p-type organic semiconductor is a phthalocyanine.
(7) The photoelectric conversion element as described in any one of (1) to (4) above, wherein the p-type organic semiconductor is a naphthalocyanine.
(8) The photoelectric conversion element as described in any one of (1) to (4) above, wherein the p-type organic semiconductor is a quinacridone.
(9) The photoelectric conversion element as described in any one of (1) to (8) above, further comprising:
a semiconductor substrate above which at least one photoelectric conversion portion is stacked;
a charge accumulating portion disposed in the semiconductor substrate and accumulating a charge generated in the photoelectric conversion layer of the photoelectric conversion portion; and
a connecting portion that electrically connects one of the pair of electrodes of the photoelectric conversion portion, the one of the pair of electrodes being for collecting the charge to the charge accumulating portion.
(10) The photoelectric conversion element as described in (9) above, further comprising an intra-substrate photoelectric conversion portion disposed in the semiconductor substrate, wherein the intra-substrate photoelectric conversion portion absorbs light transmitted through the photoelectric conversion layer of the photoelectric conversion portion and generating and accumulating a charge in proportion to an amount of the light.
(11) The photoelectric conversion element as described in (10) above, wherein the intra-substrate photoelectric conversion portion comprises a plurality of photodiodes stacked in the semiconductor substrate and capable of absorbing light having different colors.
(12) The photoelectric conversion element as described in (11) above, wherein the plurality of photodiodes are arranged in a direction perpendicular to an incident direction of the light.
(13) The photoelectric conversion element as described in (11) or (12) above, wherein
the number of photoelectric conversion portions stacked above the semiconductor substrate is one,
the plurality of photodiodes includes a photodiode absorbing light in a blue wavelength region and a photodiode absorbing light in a red wavelength region, and the photoelectric conversion layer of the photoelectric conversion portion absorbs light in a green wavelength region.
(14) The photoelectric conversion element as described in any one of (9) to (13) above, wherein a photoelectric conversion material of the at least one photoelectric conversion portion is an organic semiconductor having a maximum peak of an absorption spectrum thereof in a near-infrared region.
(15) The photoelectric conversion element as described in (14) above, wherein the photoelectric conversion material is transparent to light in a visible region.
(16) The photoelectric conversion element as described in (15) above, wherein the photoelectric conversion material is SnPc or a silicon naphthalocyanine.
(17) A solid-state imaging device comprising:
a plurality of photoelectric conversion elements as described in any one of (9) to (16 above in an array form; and
a signal read-out portion that reads out a signal corresponding to a charge accumulated in a charge accumulating portion in each of the plurality of photoelectric conversion elements.
(18) A solid-state imaging device comprising:
a semiconductor substrate;
a plurality of photoelectric conversion elements as described in any one of (1) to (8) above in an array form above the semiconductor substrate;
a color filter layer disposed above the semiconductor layer and transmitting light in a wavelength region different from that absorbed by the photoelectric conversion layer;
an intra-substrate photoelectric conversion element disposed in the semiconductor substrate and below the photoelectric conversion layer and absorbing the light having transmitted through the color filter layer and the photoelectric conversion layer to generate a charge in proportion to the light; and
a signal read-out portion that reads out a signal generated in the intra-substrate photoelectric conversion layer and a signal corresponding to a charge generated in the photoelectric conversion element.
(19) The solid-state imaging device as described in (18) above, wherein the color filter is disposed above the photoelectric conversion layer.
(20) The solid state imaging device as described in (19) above, wherein the color filter layer includes a plurality of color filters corresponding to the respective photoelectric conversion elements, and the plurality of color filters are classified into a plurality of kinds of color filters transmitting light of different wavelength regions.
(21) A method for producing a photoelectric conversion element that includes a photoelectric conversion portion including a pair of electrodes and a photoelectric conversion layer between the pair of electrodes,
the method comprising forming at least part of the photoelectric conversion layer that mixed layer of a p-type organic semiconductor and a fullerene, by coevaporation so that a mixing ratio of the fullerene to the p-type organic semiconductor in terms of thickness ratio is less than 1:1.

BRIEF DESCRIPTION OF THE DRAWINGS

The features of the invention will appear more fully upon consideration of the exemplary embodiments of the inventions, which are schematically set forth in the drawings, in which.

DETAILED DESCRIPTION OF THE EXEMPLARY EMBODIMENTS

According to an aspect of the present invention, there can be provided a photoelectric conversion element which can improve the photoelectric conversion efficiency with suppressing generation of dark current.

Exemplary embodiments of the present invention will be described below by reference to drawings.

In this specification, the term "photoelectric conversion layer" means a layer that absorbs incident light in a particular wavelength and generates electrons and holes in proportion to the amount of absorbed light.

First Embodiment

Figure 1:
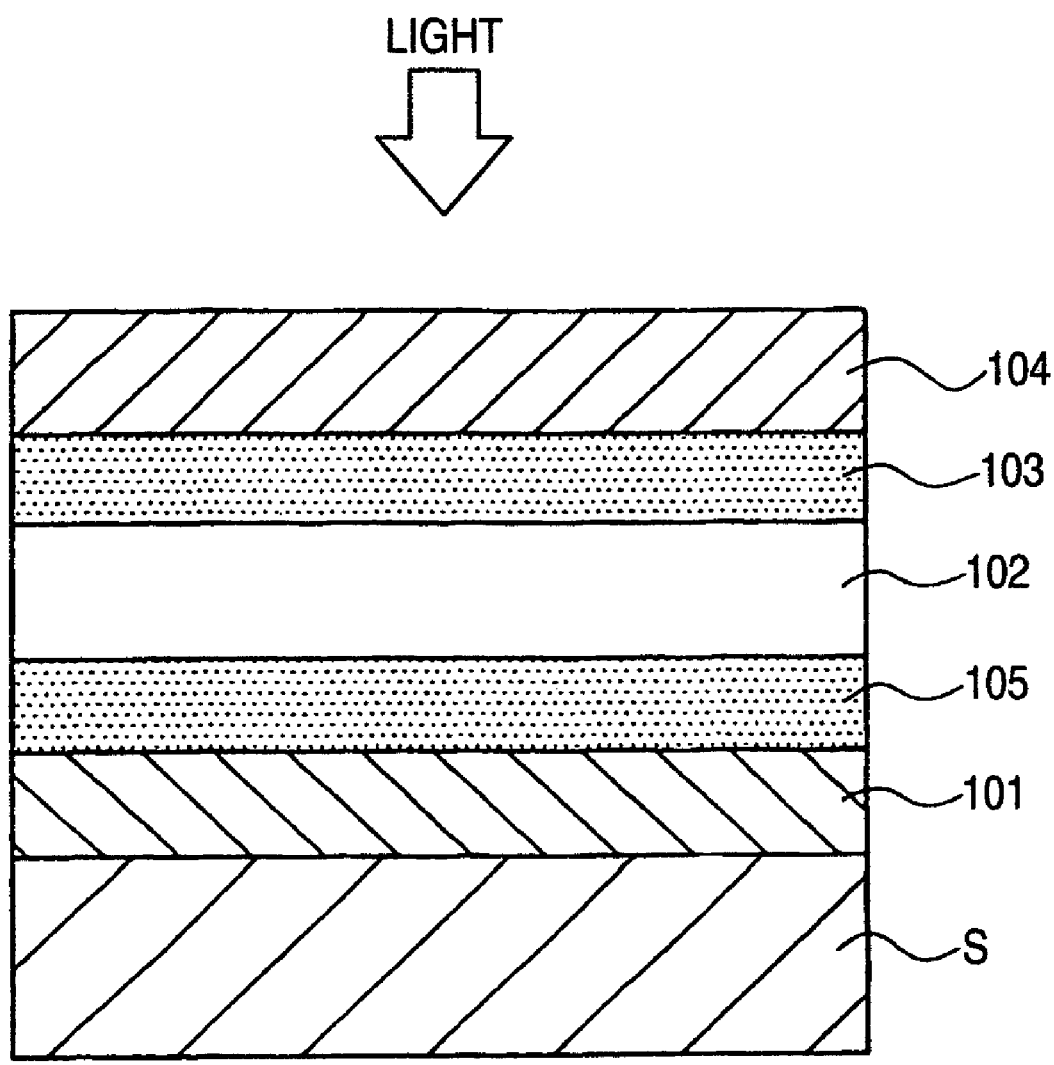
FIG. 1 is a schematic cross-sectional view showing a photoelectric conversion element of a first exemplary embodiment of the invention.

FIG. 1 is a schematic cross-sectional view showing a fundamental structure of a photoelectric conversion element of a first exemplary embodiment of the invention.

The photoelectric conversion element shown in FIG. 1 includes a substrate S, a lower electrode 101 (pixel electrode) formed on the substrate S, an electron-blocking layer 105 formed on the lower electrode 101, a photoelectric conversion layer 102 formed on the electron-blocking layer 105, a hole-blocking layer 103 formed on the photoelectric conversion layer 102, and an upper electrode 104 (opposing electrode) formed on the hole-blocking layer 103.

The photoelectric conversion layer 102 includes an organic material having the ability of photoelectric conversion. As the organic material, various organic semiconductor materials used in, for example, photosensitive materials for electrophotography may be used. Of them, materials having a quinacridone structure or organic materials having a phthalocyanine structure are particularly preferred from the standpoints of high photoelectric conversion performance, excellent color separation upon producing spectral light, high durability against long-time irradiation with light, and excellent ease with respect to vacuum evaporation.

In a photoelectric conversion element in accordance with the invention, at least part of the photoelectric conversion layer 102 contains a mixed layer of a p-type organic semiconductor and a fullerene, and the mixing ratio of the p-type organic semiconductor to the fullerene in terms of thickness ratio is less than 1:1. As the p-type semiconductor, a phthalocyanine, a naphthalocyanine, and a quinacridone are preferably used as will be described hereinafter.

In the case where quinacridone represented by the following chemical formula is used in the photoelectric conversion layer 102, it is possible for the photoelectric conversion layer 102 to absorb light in a green wavelength region and generate a charge in proportion to the amount of absorbed light. In the case where zinc phthalocyanine represented by the following chemical formula is used in the photoelectric conversion layer 102, it is possible for the photoelectric conversion layer 102 to absorb light in a red wavelength region and generate a charge in proportion to the amount of absorbed light.

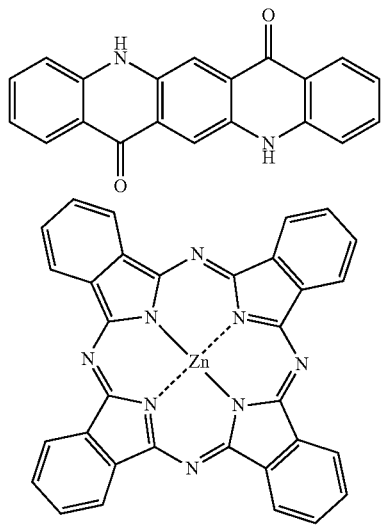

In the case where the hole-blocking layer 103 formed on the photoelectric conversion layer 102 also functions to reduce the damages which the photoconductive conversion layer 102 suffers upon formation of the upper electrode 104, the thickness of the photoelectric conversion layer 102 can be reduced as compared with the structure in the related art in which the upper electrode 104 is directly formed on the photoelectric conversion layer 102. In consideration of light absorbance and reduction of a bias voltage to be applied, the thickness of the photoelectric conversion layer 102 is preferably from about 10 nm to about 200 nm.

The photoelectric conversion element shown in FIG. 1 is adapted to receive incident light from above the upper electrode 104. Also, the photoelectric conversion element shown in FIG. 1 is adapted to apply a bias voltage across the lower electrode 101 and the upper electrode 104 so that, of the charges (holes and electrons) generated in the photoelectric conversion layer 102, holes can move to the lower electrode 101 and electrons can move to the upper electrode 104. That is, the upper electrode 104 is intended to function as an electrode for collecting electrons, whereas the lower electrode 101 is intended to function as an electrode for collecting holes.

The upper electrode 104 includes a transparent electrically conductive material since it is necessary to introduce light into the photoelectric conversion layer 102. Here, "transparent" means to transmit about 80% or more of visible light of from about 420 nm to about 660 nm in wavelength. As the transparent electrically conductive material, ITO can preferably be used.

The lower electrode 101 includes an electrically conductive material, and the lower electrode 101 is not required to be transparent. However, with the photoelectric conversion element shown in FIG. 1, there exists the case where it is necessary to transmit light as far as under the lower electrode 101 as will be described hereinafter, and hence the lower electrode 101 may include a transparent electrically conductive material as well. As is the same with the upper electrode 104, use of ITO is preferred with respect to the lower electrode 101 as well.

The organic material constituting the photoelectric conversion layer 102 contains a p-type organic semiconductor, and it may contain the n-type organic semiconductor. As the p-type organic semiconductor and the n-type organic semiconductor, any one of quinacridone derivatives, naphthalene derivatives, anthracene derivatives, phenanthrene derivatives, tethracene derivatives, pyrene derivatives, perylene derivatives, and fluoranthene derivatives can be used.

The p-type organic semiconductors (compounds) are donor organic semiconductors, are mainly represented by those organic compounds which transport holes, and are organic compounds having electron-donating properties. More particularly, when two organic compounds are used in contact with each other, the organic compound showing a smaller ionization potential is referred to as the p-type organic semiconductor. Therefore, any organic compound that has electron-donating properties can be used as the donor organic compound. For example, triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, condensed aromatic hydrocarbon cyclic compounds (e.g., naphthalene derivatives, anthracene derivatives, phenanthrene derivatives, tethracene derivatives, pyrene derivatives, perylene derivatives, and fluoranthene derivatives), and metal complexes having as a ligand a nitrogen-containing hetero cyclic compound can be used. Additionally, these are not limitative and, as is described above, an organic compound having a smaller ionization potential than the organic compound used as an n-type (acceptor) compound may be used as the donor organic semiconductor.

The n-type organic semiconductors (compounds) are donor organic semiconductors, are mainly represented by those organic compounds which transport electrons, and are organic compounds having electron-accepting properties. More particularly, when two organic compounds are used in contact with each other, the organic compound showing a larger electron affinity is referred to as the n-type organic semiconductor. Therefore, any organic compound that has electron-accepting properties can be used as the acceptor organic compound. For example, condensed aromatic hydrocarbon ring compounds (e.g., naphthalene derivatives, anthracene derivatives, phenenthrene derivatives, thetracene derivatives, pyrene derivatives, perylene derivatives, and fluoranthene derivatives), 5- to 7-membered hetero cyclic compounds containing nitrogen atom, oxygen atom or sulfur atom (e.g., pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrazolidine, pyrrolopyridine, thiadiazolopyridine, dibenzazepine, tribenzazepine, etc.), polyarylene compounds, fluorine compounds, cyclopentadiene compounds, silyl compounds, and metal complexes having as a ligand a nitrogen-containing hetero ring compound are illustrated. Additionally, these are not limitative and, as is described above, an organic compound having a larger affinity for electron than the organic compound used as a donor organic compound may be used as the acceptor organic semiconductor.

As p-type organic dyes which can be used as a p-type organic semiconductor or n-type organic dyes which can be used as a n-type organic semiconductor, any dye may be used, but preferred examples thereof include cyanine dyes, styryl dyes, hemicyanine dyes, merocyanine dyes (including zero methine merocyanines (simple merocyanines)), trinuclear merocyanine dyes, tetranuclear merocyanine dyes, rhodacyanine dyes, complex cyanine dyes, complex merocyanine dyes, allopolar dyes, oxonol dyes, hemioxonol dyes, squalium dyes, croconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugido dyes, perylene dyes, phenazine dyes, phenothiazine dyes, quinone dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, porphyrin dyes, chlorophyll dyes, phthalocyanine dyes, metal complex dyes, condensed aromatic hydrocarbon cyclic dyes (naphthalene derivatives, anthracene derivatives, phenanthrene derivatives, thetracene derivatives, pyrene derivatives, perylene derivatives, and fluoranthene derivatives).

Next, the metal complex compounds will be described below. The metal complex compounds are metal complexes which have a ligand containing at least one nitrogen atom, oxygen atom or sulfur atom and coordinating to a metal. The metal ion in the metal complex is not particularly limited, but is preferably beryllium ion, magnesium ion, aluminum ion, gallium ion, zinc ion, indium ion, or tin ion, more preferably beryllium ion, aluminum ion, gallium ion, or zinc ion, still more preferably aluminum ion or zinc ion. As the ligand contained in the above-described metal complex, various publicly known ligands may be cited. For example, there are illustrated those ligands which are described in *Photochemistry and Photophysics of Coordination Compounds*, published by Springer-Verlag in 1987 and written by H. Yersin; and *Yuki Kinzoku Kagaku-Kiso to Oyo* published by Shokabo in 1982 and written by Akio Yamamoto.

The ligand is preferably a nitrogen-containing hetero cyclic ligand (containing preferably from 1 to 30 carbon atoms, more preferably from 2 to 20 carbon atoms, particularly preferably from 3 to 15 carbon atoms) and may be a monodentate ligand or a ligand having two or more coordinating sites. The ligand is preferably a bidentate ligand. Examples thereof include a pyridine ligand, a bipyridyl ligand, a quinolinol ligand, a hydroxyphenylazole ligand (e.g., a hydroxyphenylbenzimidazole ligand, a hydroxyphenylbenzoxazole ligand or a hydroxyphenylimidazole ligand), an alkoxy ligand (containing preferably from 1 to 30 carbon atoms, more preferably from 1 to 20 carbon atoms, particularly preferably from 1 to 10 carbon atoms, and being exemplified by methoxy, ethoxy, butoxy, and 2-ethylhexyloxy), an aryloxy ligand (containing preferably from 6 to 30 carbon atoms, more preferably from 6 to 20 carbon atoms, particularly preferably from 6 to 12 carbon atoms, and being exemplified by phenyloxy, 1-naphthyloxy, 2-naphthyloxy, 2,4,6-trimethylphenyloxy, and 4-biphenyloxy), a heteroaryloxy ligand (containing preferably from 1 to 30 carbon atoms, more preferably from 1 to 20 carbon atoms, particularly preferably from 1 to 12 carbon atoms, and being exemplified by pyridyloxy, pyrazyloxy, pyrimidyloxy, and quinolyloxy), an alkylthio ligand (containing preferably from 1 to 30 carbon atoms, more preferably from 1 to 20 carbon atoms, particularly preferably from 1 to 12 carbon atoms, and being exemplified by methylthio and ethylthio), an arylthio ligand (containing preferably from 6 to 30 carbon atoms, more preferably from 6 to 20 carbon atoms, particularly preferably from 6 to 12 carbon atoms, and being exemplified by phenylthio), a hetero ring-substituted thio ligand ((containing preferably from 1 to 30 carbon atoms, more preferably from 1 to 20 carbon atoms, particularly preferably from 1 to 12 carbon atoms, and being exemplified by pyridylthio, 2-benzimidazolylthio, 2-benzoxazolylthio, and 2-benzothiazolylthio), or a siloxy ligand (containing preferably from 1 to 30 carbon atoms, more preferably from 3 to 25 carbon atoms, particularly preferably from 6 to 20 carbon atoms, and being exemplified by a triphenylsiloxy group, a triethoxysiloxy group, and a triisopropylsiloxy group), more preferably a nitrogen-containing hetero cyclic ligand, an aryloxy ligand, a heteroaryloxy ligand, or a siloxy ligand, sill more preferably a nitrogen-containing hetero cyclic ligand, an aryloxy ligand, or a siloxy ligand.

The hole-blocking layer 103 includes a material which transmits 80% or more, preferably 90% or more, visible light of from about 420 nm to about 660 nm in wavelength since it is necessary to introduce light into the photoelectric conversion layer 102. Also, it is necessary for the hole-blocking layer 103 to suppress injection of holes from the upper electrode 104 to the photoelectric conversion layer 102 and, at the same time, to transport electrons generated in the photoelectric conversion layer 102 upon application of a bias voltage. Therefore, as is described hereinbefore, materials having low hole-transporting and hole-injecting properties and high electron-transporting properties are used.

Next, candidate substances for the organic materials constituting the hole-blocking layer 103 and the electron-blocking layer 105 will be described below.

(Hole-Blocking Layer)

Electron-accepting organic materials may be used for the hole-blocking layer 103.

As the electron-accepting materials, there may be used oxadiazole derivatives such as 1,3-bis(4-tert-butylphenyl-1,3,4-oxadiazolyl)phenylene (OXD-7); anthraquinodimethane derivatives; diphenylquinone derivatives; bathocuproin, bathophenanthroline, and derivatives thereof; triazole compounds; tris(8-hydroxyquinolinato)aluminum complex and bis(4-methyl-8-quinolinato)aluminum complex; distyrylarylene derivatives; and silol compounds. Also, among materials which are not electron-accepting organic materials, those materials can be used which have sufficient electron-transporting properties. Porphyrin series compounds, styryl compounds such as DCM (4-dicyanomethylene-2-methyl-6-(4-dimethylaminostyryl)-4H-pyran), and 4H pyran compounds may be used.

The thickness of the hole-blocking layer 103 is preferably from 10 nm to 200 nm, more preferably from 30 nm to 150 nm, particularly preferably from 50 nm to 100 nm. Because, in case when this thickness is too small, dark current-suppressing effect may be reduced, and in case when the thickness is too thick, photoelectric conversion efficiency may be reduced.

As candidate substances for the hole-blocking materials, there are specifically illustrated materials represented by the following chemical formulae. Ea stands for an electron affinity, and Ip represents an ionization potential of the material.

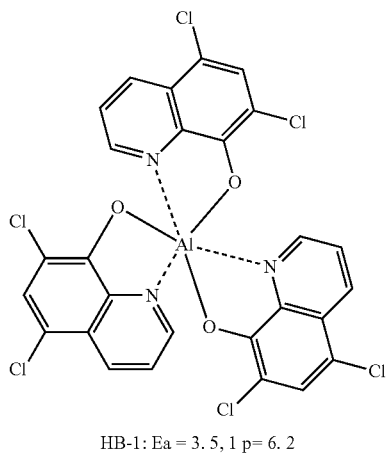

HB-1: Ea = 3.5, Ip = 6.2

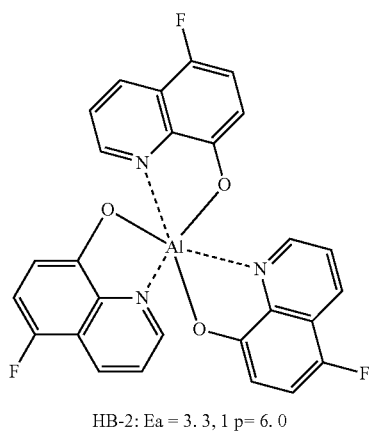

HB-2: Ea = 3.3, Ip = 6.0

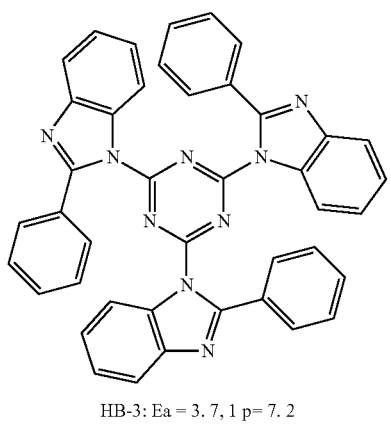

HB-3: Ea = 3.7, Ip = 7.2

-continued

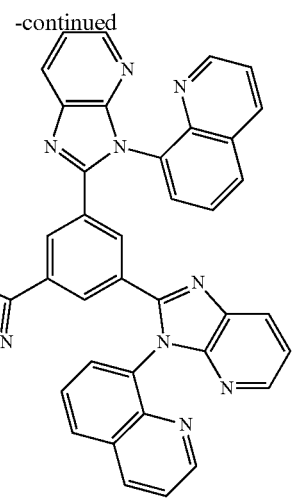

HB-4: Ea = 3.6, Ip = 7.6

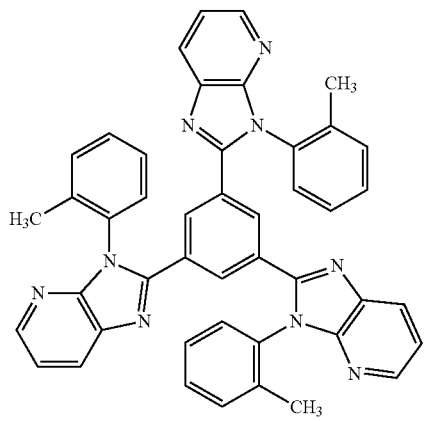

HB-5: Ea = 3.6, Ip = 7.6

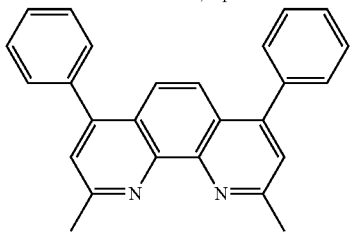

BCP: Ea = 3.2, Ip = 6.7

As to materials to be actually used for the hole-blocking layer 103, width of choice is limited by the material of the adjacent electrode and the material of the adjacent photoelectric conversion layer. A material is preferred which has a larger ionization potential (Ip) than work function (Wf) of the material of the adjacent electrode by 1.3 eV or more and has an Ea equal to, or more than, the electron affinity (Ea) of the material of the adjacent photoelectric conversion layer.

(Electron-Blocking Layer)

Electron-donating organic materials may be used for the electron-blocking layer 105. For example, as low-molecular materials, there may be used aromatic diamine compounds such as N,N'-bis(3-methylphenyl)-(1,1'-biphenyl)-4,4'-diamine (TPD) and 4,4'-bis[N-(naphthyl)-N-phenyl-amino]biphenyl (α-NPD); oxazole, oxadiazole, triazole, imidazole, and imidazolone; stilbene derivatives; pyrazoline derivatives; tetrahydroimidazole; polyarylalkane; butadiene; 4,4',4''-tris(N-(3-methylphenyl)-N-phenylamino)triphenylamine (m-MTDATA); porphyrine compounds such as porphine, copper tetraphenylporphine, phthalocianine, copper phthalocyanine, and titanium phthalocyanine oxide; triazole derivatives; oxadiazole derivatives; imidazole derivatives; polyarylalkane derivatives; pyrazoline derivatives; pyrazolone derivatives; phenylenediamine derivatives; anneal amine derivatives; amino-substituted chalcone derivatives; oxazole derivatives; styrylanthracene derivatives; fluorenone derivatives; hydrazone derivatives; and silazane derivatives. As high-molecular materials, there may be used polymers of phenylenevinylene, fluorine, carbazole, indole, pyrene, pyrrole, picoline, thiophene, acetylene, diacetylene, etc. and derivatives thereof. Among materials which are not electron-donating organic materials, those materials can be used which have sufficient hole-transporting properties.

The thickness of the electron-blocking layer 105 is preferably from 10 nm to 200 nm, more preferably from 30 nm to 150 nm, particularly preferably from 50 nm to 100 nm. Because, in case when this thickness is too small, dark current-suppressing effect may be reduced, and in case when too thick, photoelectric conversion efficiency may be reduced.

As candidate substances for the electron-blocking materials, there are specifically illustrated materials represented by the following chemical formulae.

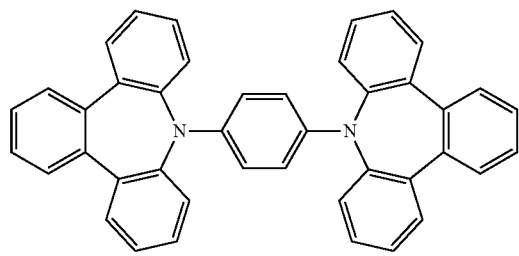

EB-1: Ea = 1. 9, 1 p = 4. 9

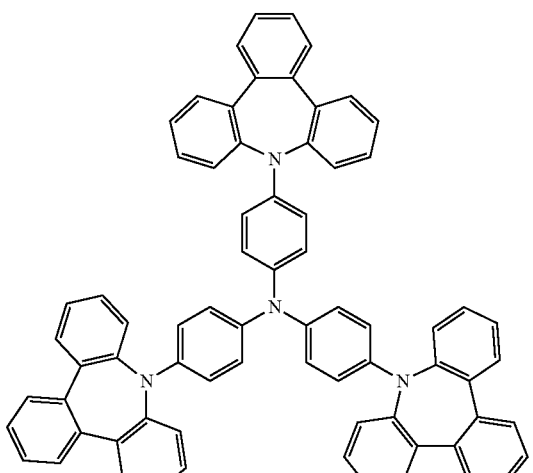

EB-2: Ea = 1. 7, 1 p = 4. 7

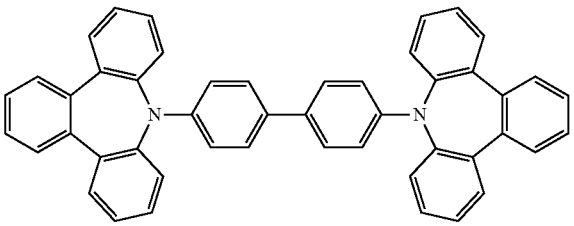

EB-3: Ea = 1. 9, 1 p = 5. 2

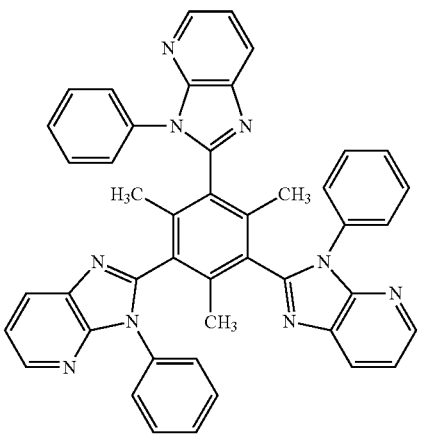

EB-4: Ea = 2. 1, 1 p = 5. 4

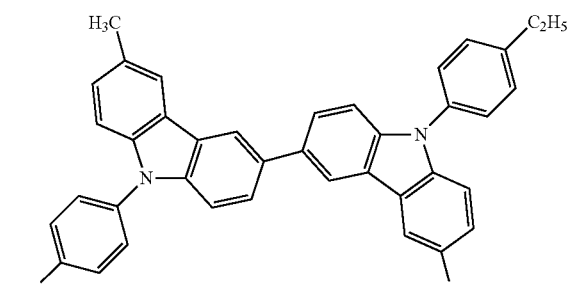

EB-5: Ea = 2. 1, 1 p = 5. 8

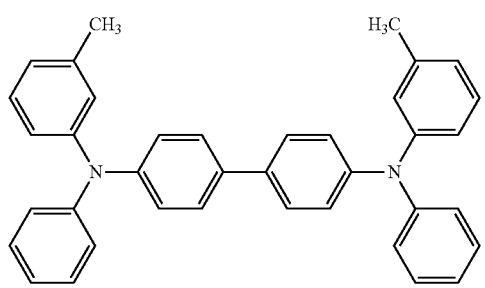

TPD: Ea = 2. 3, 1 p = 5. 5

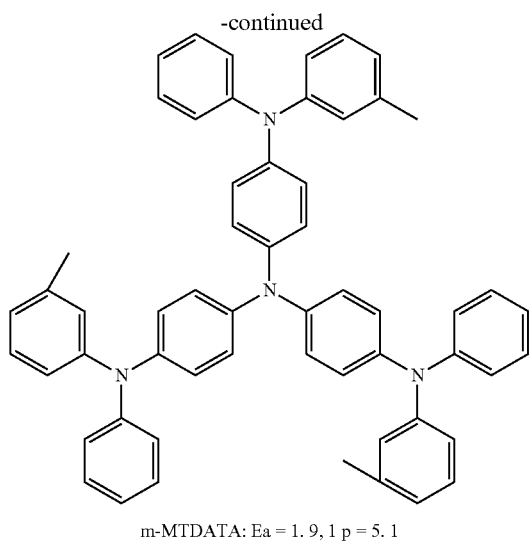

m-MTDATA: Ea = 1.9, Ip = 5.1

As to materials to be actually used for the electron-blocking layer 105, width of choice is limited by the material of the adjacent electrode and the material of the adjacent photoelectric conversion layer 102. A material is preferred which has a larger electron affinity (Ea) than work function (Wf) of the material of the adjacent electrode by 1.3 eV or more and has an Ip equal to, or smaller than, the ionization potential (Ip) of the material of the adjacent photoelectric conversion layer 102.

Additionally, in order to suppress injection of charges from one of the pair of the upper electrode 104 and the lower electrode 101 into the photoelectric conversion layer 102, a structure may be employed in which a first charge-blocking layer (for example, the hole-blocking layer 103) is formed between one of the electrodes (for example, the upper electrode 104) and the photoelectric conversion layer 102. Also, a structure may be employed in which a second charge-blocking layer (for example, the electron-blocking layer 105) is formed between the other electrode (for example the lower electrode 101) and the photoelectric conversion layer 102.

The value obtained by dividing the voltage externally applied across the upper electrode 104 and the lower electrode 101 by the distance between the electrode 101 and the electrode 104 is preferably from $1.0 \times 10^5$ V/cm to $1.0 \times 10^7$ V/cm.

The photoelectron conversion element of this embodiment contains the photoelectric conversion layer at least part of which contains a mixed layer of p-type organic semiconductor and a fullerene with the mixing ratio of the fullerene to the p-type organic semiconductor in terms of thickness ratio is less than 1:1.

In the following second to fifth embodiments, structural examples of a sensor in which the photoelectric conversion element as described above is stacked on or above a semiconductor substrate are described. Additionally, in the embodiments to be described hereinafter, descriptions on members having the same structure and the same function as those of the members already described are simplified or omitted by applying the same reference numerals and signs or corresponding reference numerals and signs to them in the drawings.

Second Embodiment

Figure 2:
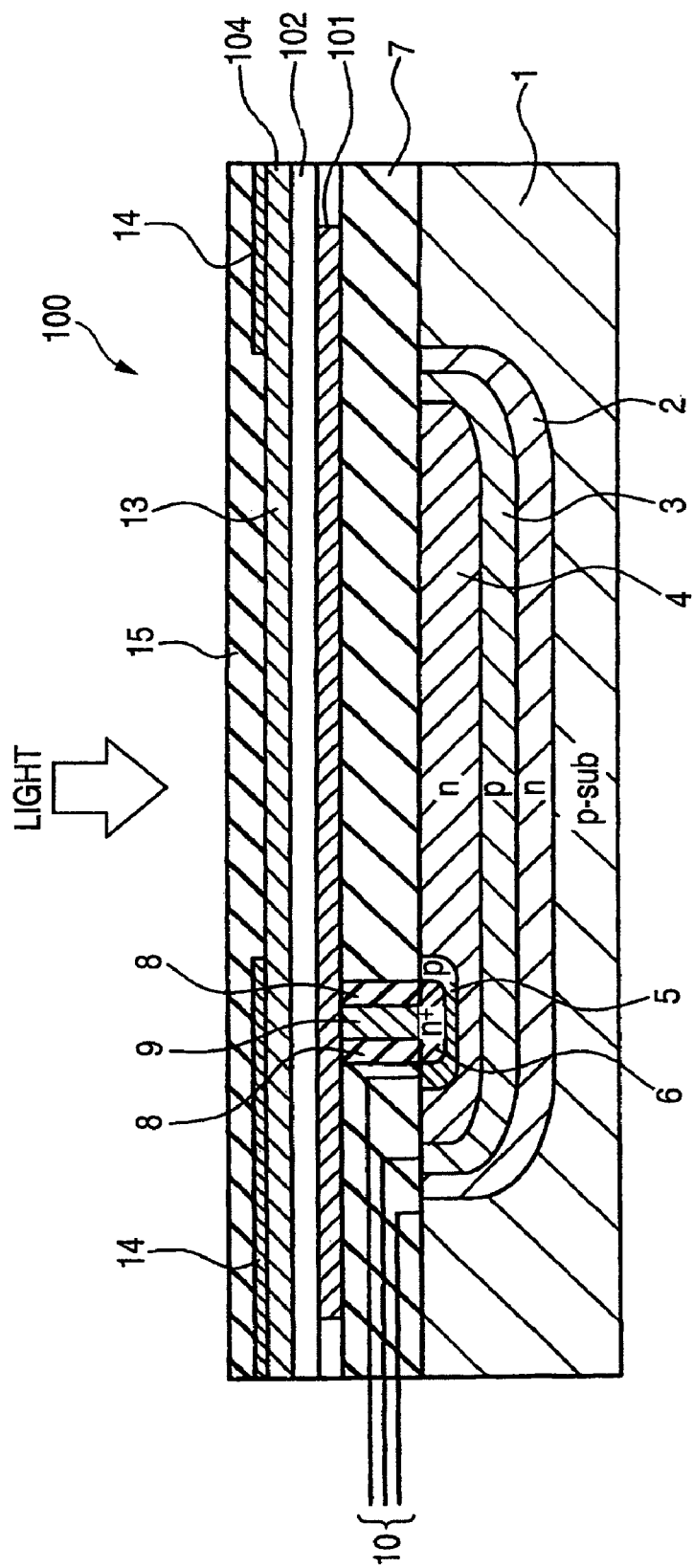
FIG. 2 is a schematic cross-sectional view showing the structure of a solid-state imaging device of a second exemplary embodiment of the invention.

FIG. 2 is a cross-sectional schematic view showing one pixel of a solid-state imaging device for illustrating a second exemplary embodiment of the invention. In FIG. 2, the same reference numerals and signs are applied to the same structural members as those in FIG. 1.

In a solid-state imaging device 100, a number of pixels shown in FIG. 2 are arranged on the same plane in an array pattern, and data on one pixel of an image data can be generated by a signal obtained from the one pixel.

One pixel of the solid-state imaging device shown in FIG. 2 includes: a p-type silicon substrate 1; a transparent insulating film 7 formed on the p-type silicon substrate 1; a photoelectric conversion element of the structure described in the first embodiment including a lower electrode 101 formed on the insulating film 7, a photoelectric conversion layer 102 formed on the lower electrode 101, a hole-blocking layer 103 (not shown) formed on the photoelectric conversion layer 102, an electron-blocking layer 105 (not shown) formed under the photoelectric conversion layer 102, and an upper electrode 104 formed on the hole-blocking layer 103; and a light shielding layer 14 having an opening and formed on the photoelectric conversion element. A transparent film 15 is formed on the upper electrode 104.

In the p-type silicon substrate 1, an n-type impurity region (hereinafter abbreviated as "n region") 4, a p-type impurity region (hereinafter abbreviated as "p region") 3, and an n region 2 are formed in this order from the shallow side of the p-type silicon substrate 1. In the surface portion of the n region 4 light-shielded by the light-shielding film 14, a highly concentrated n region (referred to as n+ region) 6 is formed, and is surrounded by a p-region 5.

The depth from the surface of the p-type silicon substrate 1 to the pn junction surface between the n region 4 and the p region 3 is adjusted to be a depth of absorbing blue light (about 0.2 μm). Thus, the n region 4 and the p region 3 form a photodiode (B photodiode) which absorbs blue light and accumulate a charge in an amount in proportion to the absorbed light. In this embodiment, the B photodiode is formed in the semiconductor substrate, and functions as a charge-accumulating portion for accumulating the charge generated in the photoelectric conversion layer of the photoelectric conversion portion 102. Electrons generated in the B photodiode are accumulated in the n region 4.

The depth from the surface of the p-type silicon substrate 1 to the pn junction surface between the n region 2 and the p-type silicon substrate 1 is adjusted to be a depth of absorbing red light (about 2 μm). Thus, the n region 2 and the p-type silicon substrate 1 form a photodiode (R photodiode) which absorbs red light and accumulate a charge generated in an amount in proportion to the absorbed light. The R photodiode is formed in the semiconductor substrate, and functions as a charge-accumulating portion for accumulating the charge generated in the photoelectric conversion layer of the photoelectric conversion portion 102. Electrons generated in the R photodiode are accumulated in the n region 2.

The n+ region 6 is electrically connected to the lower electrode 101 via a connecting portion 9 formed in an opening formed in the insulating film 7. Holes collected by the lower electrode 101 recombine with electrons in the n+ region 6, and hence electrons accumulated upon resetting in the n+ region 6 are to be reduced corresponding to the number of collected holes. The connecting portion 9 is electrically insulated by the insulating film 8 except for the lower electrode 101 and the n+ region 6.

Electrons accumulated in the n region 2 are converted to a signal corresponding to the charge amount by a MOS circuit (not shown) including an n-channel MOS transistor formed in the p-type silicon substrate 1, electrons accumulated in the n region 4 are converted to a signal corresponding to the charge amount by a MOS circuit (not shown) including an n-channel MOS transistor formed in the p region 3, and electrons accumulated in the n+ region 6 are converted to a signal corresponding to the charge amount by a MOS circuit (not shown) including an n-channel MOS transistor formed in the p region 5, and then outputted to the outside of the solid-state imaging device 100. Each MOS circuit is connected to a signal read-out pad not shown by a wiring 10. Additionally, when the n region 2 and the n region 4 are provided with extraction electrodes and a reset voltage is applied thereto, each region is depleted, and the capacity of each pn junction portion becomes extremely small. Thus, the capacity to be generated at the junction surface can be made extremely small.

By the above-described structure, G light can be photoelectrically converted in the photoelectric conversion layer 102, and B light and R light can be photoelectrically converted by the B photodiode and the R photodiode in the p-type silicon substrate 1, respectively. Also, since G light is first absorbed by the upper portion, color separation between B and G and between G and R is excellent. This is the greatly excellent point in comparison with a solid-state imaging device in which three PDs are stacked in the silicon substrate and all of B, G, and R lights are separated from each other in the substrate.

In the solid-state imaging device 100 of this embodiment, at least part of the photoelectric conversion layer 102 contains a mixed layer of a p-type organic semiconductor and a fullerene, and the mixing ratio of the fullerene to the p-type organic semiconductor in terms of thickness ratio is less than 1:1.

Third Embodiment

In this embodiment, two photodiodes are not stacked in the silicon substrate 1 shown in FIG. 2, but are arranged in the direction perpendicular to the incident direction of light to detect two colors of the light in the p-type silicon substrate.

Figure 3:
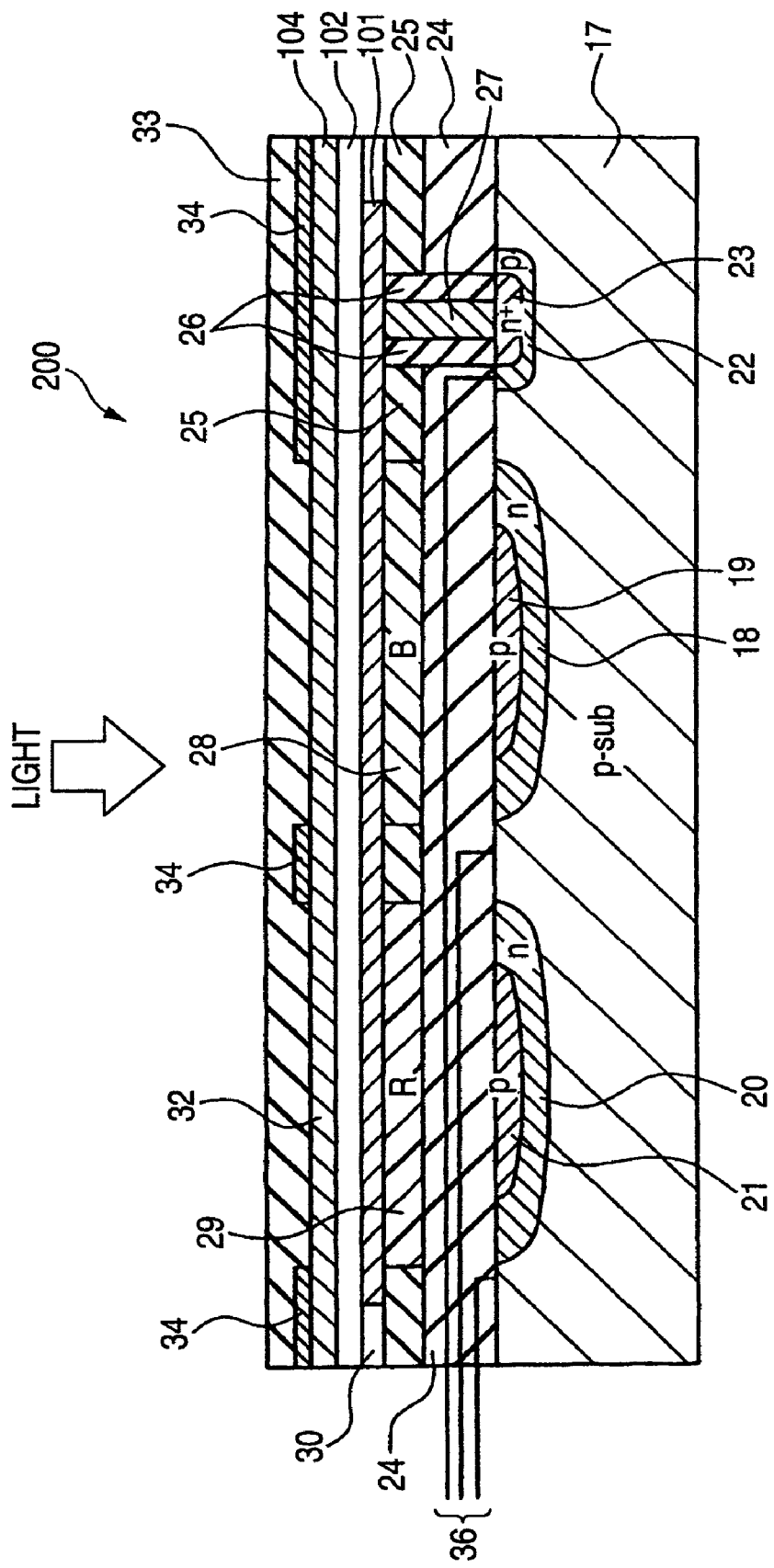
FIG. 3 is a schematic cross-sectional view showing the structure of a solid-state imaging device of a third exemplary embodiment of the invention.

FIG. 3 is a cross-sectional schematic view showing one pixel of a solid-state imaging device for illustrating a third exemplary embodiment of the invention. In FIG. 3, the same reference numerals and signs are applied to the same structural members as those in FIG. 1.

One pixel of the solid-state imaging device 200 shown in FIG. 3 includes a p-type silicon substrate 17, and a photoelectric conversion element of the structure described in the first embodiment including a lower electrode 101 formed above the p-type silicon substrate 17, a photoelectric conversion layer 102 formed on the lower electrode 101, a hole-blocking layer 103 (not shown) formed on the photoelectric conversion layer 102, an electron-blocking layer 105 (not shown) formed under the photoelectric conversion layer 102, and an upper electrode 104 formed on the hole-blocking layer 103 and, on the photoelectric conversion element, a light shielding layer 34 having an opening is formed. Also, a transparent film 33 is formed on the upper electrode 104.

In the surface portion of the p-type silicon substrate 17 located under the opening of the light-shielding film 34, a photodiode including a p region 19 and an n region 18 and a photodiode including a p region 21 and an n region 20 are formed side by side. Any plane direction on the surface of the p-type silicon substrate 17 is a direction perpendicular to the incident direction of an entering light.

A color filter 28 transmitting B light via a transparent insulating film 24 is formed above the photodiode including the p region 19 and the n region 18, and a color filter 29 transmitting R light via a transparent insulating film 24 is formed above the photodiode including the p region 21 and the n region 20, with the lower electrode 101 being formed on them. The color filters 28 and 29 are surrounded by a transparent insulating film 25.

The photodiode including the p region 19 and the n region 18 functions as an intra-substrate photoelectric conversion portion which absorbs B light transmitted through the color filter 28, generates electrons in proportion to the absorbed light, and accumulates generated electrons in the n region 18. The photodiode including the p region 21 and the n region 20 functions as an intra-substrate photoelectric conversion portion which absorbs R light transmitted through the color filter 29, generates electrons in proportion to the absorbed light, and accumulates generated electrons in the n region 20.

An n+ region 23 is formed in the surface portion of the n-type silicon substrate 17 shielded by the light-shielding film 34, and is surrounded by the p region 22.

The n+ region 23 is electrically connected to the lower electrode 101 via a connecting portion 27 formed in an opening formed in the insulating films 24 and 25. Holes collected by the lower electrode 101 recombine with electrons in the n+ region 23, and hence electrons accumulated upon resetting in the n+ region 23 are to be reduced corresponding to the number of collected holes. The connecting portion 27 is electrically insulated by the insulating film 26 except for the lower electrode 101 and the n+ region 23.

Electrons accumulated in the n region 18 are converted to a signal corresponding to the charge amount by a MOS circuit (not shown) including an n-channel MOS transistor formed in the p-type silicon substrate 17, electrons accumulated in the n region 20 are converted to a signal corresponding to the charge amount by a MOS circuit (not shown) including an n-channel MOS transistor formed in the p-type silicon substrate 17, and electrons accumulated in the n+ region 23 are converted to a signal corresponding to the charge amount by a MOS circuit (not shown) including an n-channel MOS transistor formed in the p region 22, and then outputted to the outside of the solid-state imaging device 200. Each MOS circuit is connected to a signal read-out pad not shown through a wiring 36.

Additionally, the signal read-out portion may be constituted not by the MOS circuit but by CCD and an amplifier. That is, the signal read-out portion may be a signal read-out portion in which electrons accumulated in the n region 18, the n region 20, and the n+ region 23 are read out to CCD formed in the p-type silicon substrate 17, and the read-out signal is transferred by means of CCD to an amplifier which, in turn, outputs a signal corresponding to the amount of the electrons.

As is described above, the signal read-out portion is illustrated by CCD and CMOS structure but, in view of electric power consumption, high speed read-out performance, pixel addition performance, partial read-out performance, etc., CMOS is preferred.

In FIG. 3, color separation of the R light and the B light from each other is performed by means of the color filters 28 and 29. However, it is also possible to adjust the depth of the pn junction surface between the n region 20 and the p region 21 and the depth of the pn junction surface between the n region 18 and the p region 19 to thereby absorb the R light and the B light by the respective photodiodes, without providing the color filters 28 and 29. In this case, it is also possible to form, between the p-type silicon substrate 17 and the lower electrode 101 (for example, between the insulating film 24 and the p-type silicon substrate 17), an inorganic photoelectric conversion portion which includes an inorganic material and can absorb light having transmitted through the photoelectric conversion layer 102, generate charges in proportion to the absorbed light amount, and accumulate them. In this case, it suffices to provide, in the p-type silicon substrate 17, a MOS circuit for reading out a signal corresponding to the amount of charges accumulated in the charge-accumulating region of the inorganic photoelectric conversion portion, with the MOS circuit being connected to the wire 36.

Also, a structure may be employed in which one photodiode is provided in the p-type silicon substrate 17, and plural photoelectric conversion portions are stacked above the p-type silicon substrate 17. Further, a structure may be employed in which plural photodiodes are provided in the p-type silicon substrate 17, and plural photoelectric conversion portions are stacked above the p-type silicon substrate 17. In addition, in the case where it is not necessary to form a color image, a structure may be employed in which one photodiode is provided in the p-type silicon substrate 17, and only one photoelectric conversion portion is stacked.

In the solid-state imaging device 200 of this embodiment, at least part of the photoelectric conversion layer 102 contains a mixed layer of a p-type organic semiconductor and a fullerene, and the mixing ratio of the fullerene to the p-type organic semiconductor in terms of thickness ratio is less than 1:1.

Fourth Embodiment

The solid-state imaging device of this embodiment has a structure in which no photodiodes are provided in the silicon substrate shown in FIG. 1 but plural (three in this embodiment) photoelectric conversion elements are stacked above a silicon substrate.

Figure 4:
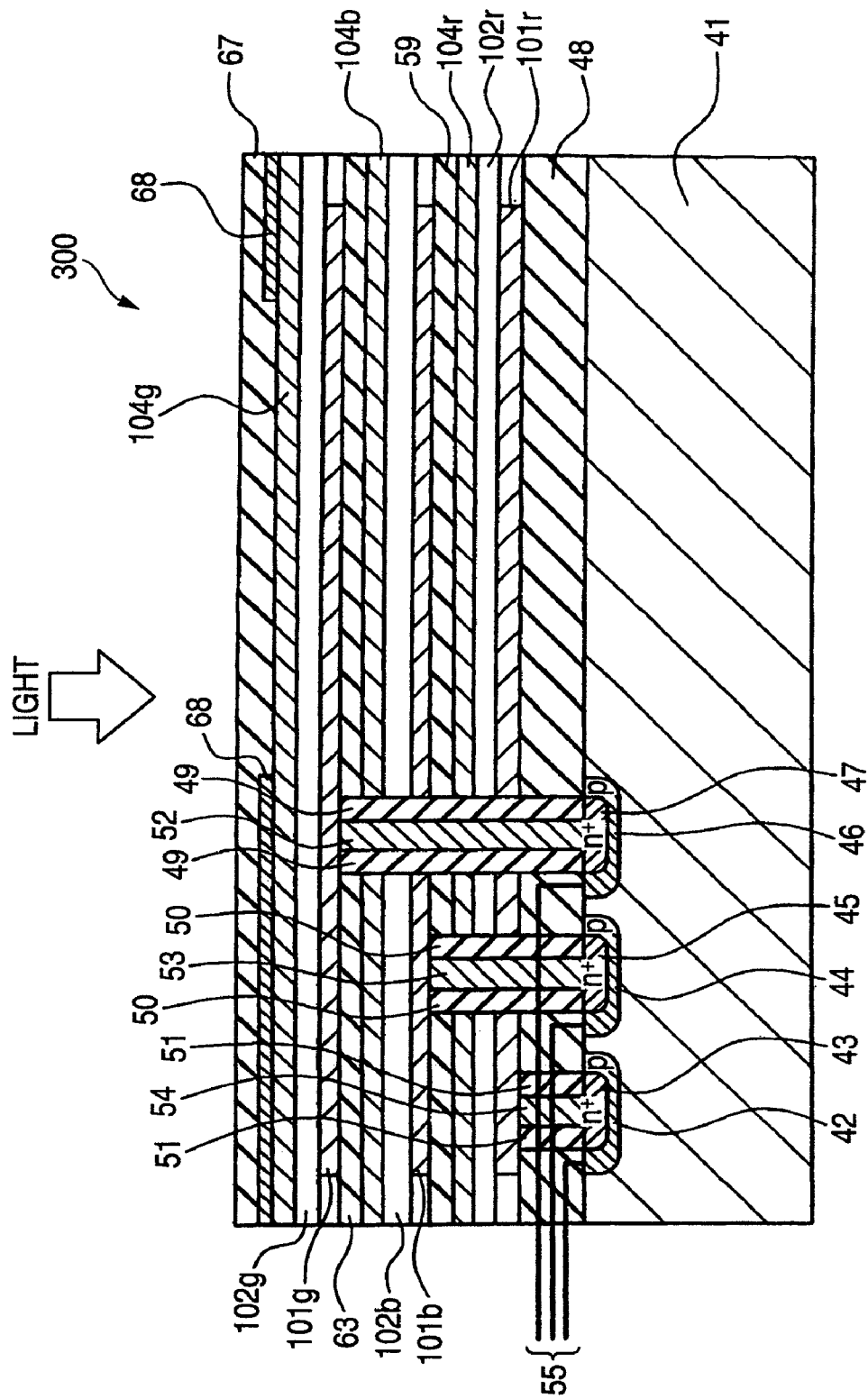
FIG. 4 is a schematic cross-sectional view showing the structure of a solid-state imaging device of a fourth exemplary embodiment of the invention.

FIG. 4 is a cross-sectional schematic view showing one pixel of a solid-state imaging device for illustrating a fourth exemplary embodiment of the invention.

A solid-state imaging device 300 shown in FIG. 4 has a structure including: an R light photoelectric conversion element including a lower electrode 101r, a photoelectric conversion layer 102r stacked on the lower electrode 101r, a hole-blocking layer (not shown) formed on the photoelectric conversion layer 102r, an electron-blocking layer (not shown) formed under the photoelectric conversion layer 102r, and an upper electrode 104r stacked on the hole-blocking layer; a B light photoelectric conversion element including a lower electrode 101b, a photoelectric conversion layer 102b stacked on the lower electrode 101b, a hole-blocking layer (not shown) formed on the photoelectric conversion layer 102b, an electron-blocking layer (not shown) formed under the photoelectric conversion layer 102b, and an upper electrode 104b stacked on the hole-blocking layer; and a G light photoelectric conversion element including a lower electrode 101g, a photoelectric conversion layer 102g stacked on the lower electrode 101g, a hole-blocking layer (not shown) formed on the photoelectric conversion layer 102g, an electron-blocking layer (not shown) formed under the photoelectric conversion layer 102g, and an upper electrode 104g stacked on the hole-blocking layer, and the R, B, G light photoelectric conversion elements are stacked in this order above the silicon substrate 41 with each of the lower electrodes contained in each element facing the silicon substrate 41 side.

A transparent insulating film 48 is formed on the silicon substrate 41, the R light photoelectric conversion element is formed thereon, an insulating film 59 is formed thereon, the B light photoelectric conversion element is formed thereon, an insulating film 63 is formed thereon, the G light photoelectric conversion element is formed thereon, a light-shielding film 68 having an opening is formed thereon, and a transparent insulating film 67 is formed thereon.

The lower electrode 101g, the photoelectric conversion layer 102g, the hole-blocking layer, the electron-blocking layer, and the upper electrode 104g contained in the G light photoelectric conversion element have the same structures as the lower electrode 101, the photoelectric conversion layer 102, the hole-blocking layer 103, the electron-blocking layer 105, and the upper electrode 104 shown in FIG. 1, respectively, provided that the photoelectric conversion layer 102g contains an organic material absorbing a green light and generating electrons and holes in proportion to the amount of the absorbed light.

The lower electrode 101b, the photoelectric conversion layer 102b, the hole-blocking layer, the electron-blocking layer, and the upper electrode 104b contained in the B light photoelectric conversion element, have the same structures as the lower electrode 101, the photoelectric conversion layer 102, the hole-blocking layer 103, the electron-blocking layer 105, and the upper electrode 104 shown in FIG. 1, respectively, provided that the photoelectric conversion layer 102b contains an organic material absorbing a blue light and generating electrons and holes in proportion to the amount of the absorbed light.

The lower electrode 101r, the photoelectric conversion layer 102r, the hole-blocking layer, the electron-blocking layer, and the upper electrode 104r contained in the R light photoelectric conversion element have the same structures as the lower electrode 101, the photoelectric conversion layer 102, the hole-blocking layer 103, the electron-blocking layer 105, and the upper electrode 104 shown in FIG. 1, respectively, provided that the photoelectric conversion layer 102r contains an organic material absorbing a red light and generating electrons and holes in proportion to the amount of the absorbed light.

In the surface portions of the silicon substrate 41 shielded by the light-shielding film 68, n+ regions 43, 45, and 47 are formed, with each of them being surrounded by p regions 42, 44, and 46, respectively.

The n+ region 43 is electrically connected to the lower electrode 101r via the connecting portion 54 formed in an opening formed in the insulating film 48. Holes collected by the lower electrode 101r recombine with electrons in the n+ region 43, and hence electrons accumulated upon resetting in the n+ region 43 are to be reduced corresponding to the number of collected holes. The connecting portion 54 is electrically insulated by the insulating film 51 except for the lower electrode 101r and the n+ region 43.

The n+ region 45 is electrically connected to the lower electrode 101b via the connecting portion 53 formed in an opening formed in the insulating film 48, the R light photoelectric conversion element and the insulating film 59. Holes collected by the lower electrode 101b recombine with electrons in the n+ region 45, and hence electrons accumulated upon resetting in the n+ region 45 are to be reduced corresponding to the number of collected holes. The connecting portion 53 is electrically insulated by the insulating film 50 except for the lower electrode 101b and the n+ region 45.

The n+ region 47 is electrically connected to the lower electrode 101g via the connecting portion 52 formed in an opening formed in the insulating layer 48, the R light photoelectric conversion element, the insulating film 59, the B light photoelectric conversion element, and in the insulating film 63. Holes collected by the lower electrode 101g recombine with electrons in the n+ region 47, and hence electrons accumulated upon resetting in the n+ region 47 are to be reduced corresponding to the number of collected holes. The connecting portion 52 is electrically insulated by the insulating film 49 except for the lower electrode 101g and the n+ region 47.

Electrons accumulated in the n+ region 43 are converted to a signal corresponding to the charge amount by a MOS circuit (not shown) including an n-channel MOS transistor formed in the p region 42, electrons accumulated in the n+ region 45 are converted to a signal corresponding to the charge amount by a MOS circuit (not shown) including an n-channel MOS transistor formed in the p region 44, and electrons accumulated in the n+ region 47 are converted to a signal corresponding to the charge amount by a MOS circuit (not shown) including an n-channel MOS transistor formed in the p region 46, and then outputted to the outside of the solid-state imaging device 300. Each MOS circuit is connected to a signal read-out pad not shown through a wiring 55. Additionally, the signal read-out portion may be constituted not by the MOS circuit but by CCD and an amplifier. That is, the signal read-out portion may be a signal read-out portion in which electrons accumulated in the n+ regions 43, 45, and 47 are read out by CCD formed within the silicon substrate 41, and the read-out signal is transferred by means of CCD to an amplifier which, in turn, outputs a signal corresponding to the amount of the holes.

In the above descriptions, the photoelectric conversion layer absorbing the B light means a layer which can absorb light of at least 400 to 500 nm in wavelength, with the absorbance at the peak wavelength in the wavelength region being preferably 50% or more. The photoelectric conversion layer absorbing the G light means a layer which can absorb light of at least 500 to 600 nm in wavelength, with the absorbance at the peak wavelength in the wavelength region being preferably 50% or more. The photoelectric conversion layer absorbing the R light means a layer which can absorb light of at least 600 to 700 nm in wavelength, with the absorbance at the peak wavelength in the wavelength region being preferably 50% or more.

In the solid-state imaging device 300 of this embodiment, at least part of the photoelectric conversion layers 102r, 102g, and 102b contains a mixed layer of a p-type organic semiconductor and a fullerene, and the mixing ratio of the fullerene to the p-type organic semiconductor in terms of thickness ratio is less than 1:1.

Fifth Embodiment

Figure 5:
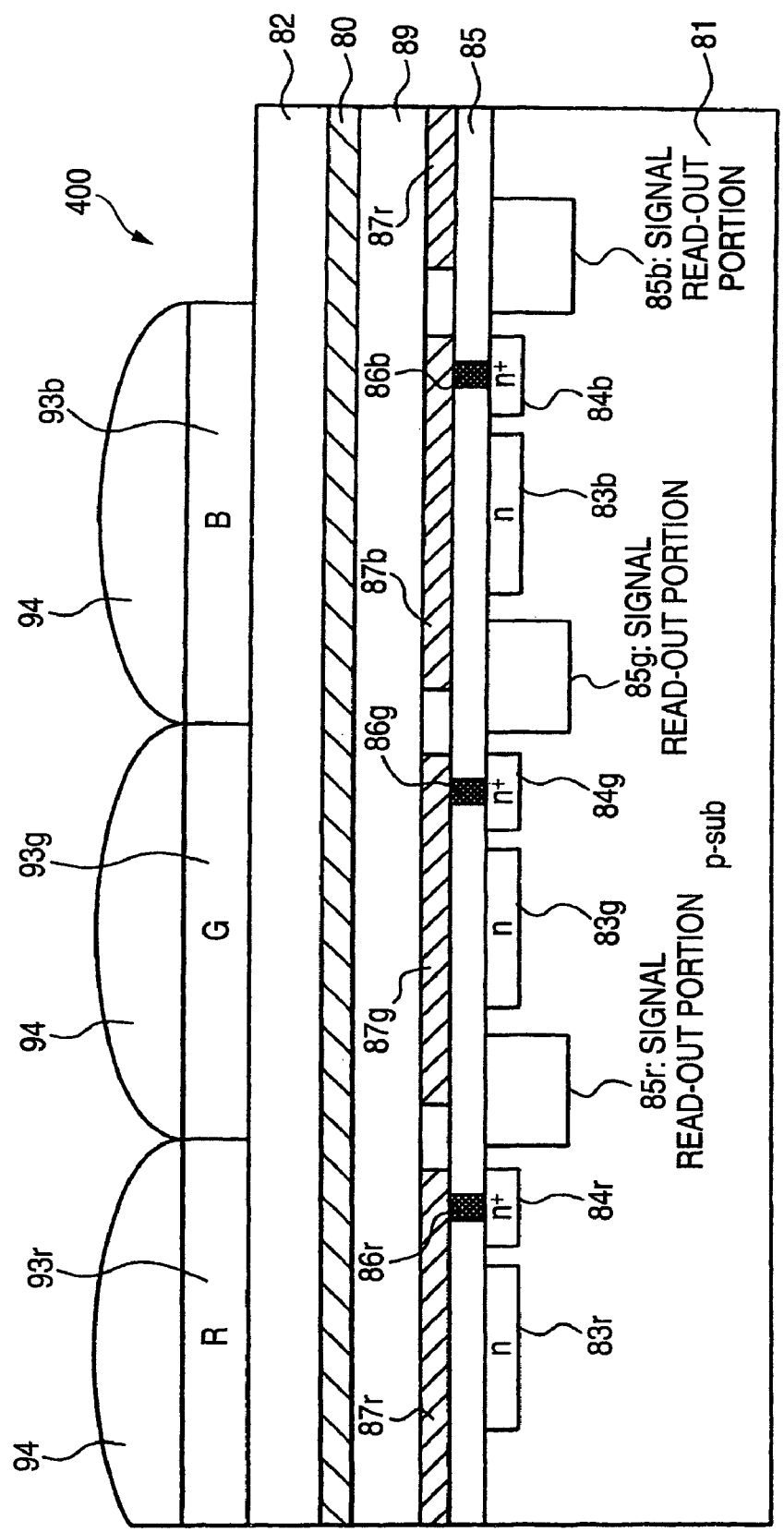
FIG. 5 is a schematic cross-sectional view showing the structure of a solid-state imaging device of a fifth exemplary embodiment of the invention.

FIG. 5 is a cross-sectional schematic view showing a solid-state imaging device for illustrating a fifth exemplary embodiment of the invention.

Three kinds of numerous color filters, i.e., color filters 93r transmitting light of mainly the wavelength region of R (red), color filters 93g transmitting light of mainly the wavelength region of G (green), and color filters 93b transmitting light of mainly the wavelength region of B (blue) are arranged on the same plane above the p-type silicon substrate 81 in a first direction (row direction) and a second direction (column direction) perpendicular to the first direction.

As materials for the color filter 93r, known materials may be used, though such materials transmit part of light in the infrared region as well as the light in the wavelength of R. As materials for the color filter 93g, known materials may be used, though such materials transmit part of light in the infrared region as well as the light in the wavelength of G. As materials for the color filter 93b, known materials may be used, though such materials transmit part of light in the infrared region as well as the light in the wavelength of B.

As the arrangement of the color filters 93r, 93g and 93b, color filter arrangements employed for known single-plate solid-state imaging devices (e.g., Bayer arrangement, longitudinal stripe arrangement, and transverse stripe arrangement) may be employed.

An n-type impurity region (hereinafter referred to as "n region") 83r is formed under the color filter 93r corresponding to the color filter 93r, and an R light photoelectric conversion element is constituted corresponding to the color filter 93r by pn junction of the n region 83r and the p-type silicon substrate 81.

An n region 83g is formed under the color filter 93g corresponding to the color filter 93g, and a G light photoelectric conversion element is constituted corresponding to the color filter 93g by pn junction of the n region 83g and the p-type silicon substrate 81.

An n region 83b is formed under the color filter 93b corresponding to the color filter 93b, and a B light photoelectric conversion element is constituted corresponding to the color filter 93b by pn junction of the n region 83b and the p-type silicon substrate 81.

A lower electrode 87r (having the same function as that of the lower electrode 101 in FIG. 1) is formed above the n region 83r, a lower electrode 87g (having the same function as that of the lower electrode 101 in FIG. 1) is formed above the n region 83g, and a lower electrode 87b (having the same function as that of the lower electrode 101 in FIG. 1) is formed above the n region 83b. The lower electrodes 87r, 87g, and 87b are divided so as to correspond to the color filters 93r, 93g, and 93b, respectively. Each of the lower electrodes 87r, 87g, and 87b is constituted by a material transmitting visible light and infrared light and, as such materials, there may be used, for example, ITO (Indium Tin Oxide) and IZO (Indium Zinc Oxide). Each of the transparent electrodes 87r, 87g, and 87b is buried in the insulating layer.

On each of the lower electrodes 87r, 87g, and 87b, there is formed a photoelectric conversion layer 89 (having the same function as that of the photoelectric conversion layer 102 in FIG. 1) of a one-sheet structure in common to the color filters 93r, 93g, and 93b, absorbing mainly light in the infrared region of 580 nm or more in wavelength to generate charges in proportion to the absorbed light and transmitting light in the visible region (from about 380 nm to about 580 nm in wavelength) other than the light of infrared region. As materials for constituting the photoelectric conversion layer 89, phthalocyanine organic materials and naphthalocyanine organic materials are used.

On the photoelectric conversion layer 89, there is formed an upper electrode 80 (having the same function as that of the upper electrode 104 in FIG. 1) of a one-sheet structure in common to the color filters 93r, 93g, and 93b. The upper electrode 80 is constituted by a material transmitting visible light and infrared light and, for example, ITO or IZO may be used. Additionally, though not shown, a hole-blocking layer having the same function as that of the hole-blocking layer 103 shown in FIG. 1 is formed between the photoelectric conversion layer 89 and the upper electrode 80.

A photoelectric conversion element corresponding to the color filter 93r is formed by the lower electrode 87r, the upper electrode 80 opposing it, and part of the photoelectric conversion layer 89 sandwiched between them. Hereinafter, this photoelectric conversion element is referred to as "an R photoelectric conversion element formed on the substrate", because it is formed on the semiconductor substrate.

A photoelectric conversion element corresponding to the color filter 93g is formed by the lower electrode 87g, the upper electrode 80 opposing it, and part of the photoelectric conversion layer 89 sandwiched between them. Hereinafter, this photoelectric conversion element is referred to as "a G photoelectric conversion element formed on the substrate".

A photoelectric conversion element corresponding to the color filter 93b is formed by the lower electrode 87b, the upper electrode 80 opposing it, and part of the photoelectric conversion layer 89 sandwiched between them. Hereinafter, this photoelectric conversion element is referred to as "a B photoelectric conversion element formed on the substrate".

An n-type impurity region of high concentration (hereinafter referred to as "n+ region") 84r connected to the lower electrode 87r of the R photoelectric conversion element formed on the substrate is formed next to the n region 83r. Additionally, for preventing light from entering into the n+ region 84r, a light-shielding film is preferably provided on the n+ region 84r.

An n+ region 84g connected to the lower electrode 87g of the G photoelectric conversion element formed on the substrate is formed next to the n region 83g. Additionally, for preventing light from entering into the n+ region 84g, a light-shielding film is preferably provided on the n+ region 84g.

An n+ region 84b connected to the lower electrode 87b of the B photoelectric conversion element formed on the substrate is formed next to the n region 83b. Additionally, for preventing light from entering into the n+ region 84b, a light-shielding film is preferably provided on the n+ region 84b.

A contact portion 86r including a metal such as tungsten or aluminum is formed on the n+ region 84r, and the lower electrode 87r is formed on the contact portion 86r, thus the n+ region 84r being electrically connected to the lower electrode 87r via the contact portion 86r. The contact portion 86r is buried in the insulating layer 85 transmitting visible light and infrared light.

A contact portion 86g including a metal such as tungsten or aluminum is formed on the n+ region 84g, and the lower electrode 87g is formed on the contact portion 86g, thus the n+ region 84g being electrically connected to the lower electrode 87g via the contact portion 86g. The contact portion 86g is buried in the insulating layer 85.

A contact portion 86b including a metal such as tungsten or aluminum is formed on the n+ region 84b, and the lower electrode 87b is formed on the contact portion 86b, thus the n+ region 84b being electrically connected to the lower electrode 87b via the contact portion 86b. The contact portion 86b is buried in the insulating layer 85.

In regions other than the n regions 83r, 83g, and 83b, and n+ regions 84r, 84g, and 84b, there are formed a signal read-out portion 85r including an n-channel MOS transistor for reading out signals corresponding to the amounts of electrons accumulated in the n region 83r and n+ region 84r, a signal read-out portion 85g including an n-channel MOS transistor for reading out signals corresponding to the amounts of electrons accumulated in the n region 83g and n+ region 84g, and a signal read-out portion 85b including an n-channel MOS transistor for reading out signals corresponding to the amounts of electrons accumulated in the n region 83b and n+ region 84b. Each of the signal read-out portions 85r, 85g, and 85b may be constituted by CCD. Additionally, for preventing light from entering into the signal read-out portions 85r, 85g, and 85b, a light-shielding film is preferably provided on each of the signal read-out portions 85r, 85g, and 85b.

Such constitution enables one to obtain both an RGB color image and an infrared image at the same time with the same resolution.

In the solid-state imaging device 400 of this embodiment, at least part of the photoelectric conversion layer 89 contains a mixed layer of a p-type organic semiconductor and a fullerene, and the mixing ratio of the fullerene to the p-type organic semiconductor in terms of thickness ratio is less than 1:1.

Of materials constituting the photoelectric conversion portions of the above-described embodiments, some of the photoelectric conversion materials may be organic semiconductors having a maximum peak of absorption spectrum in the near-infrared region. In such occasion, it is preferred for the photoelectric conversion material to be transparent to visible light. More preferably, the photoelectric conversion material is SnPc or a silicon naphthalocyanine.

Hereinafter, examples of the invention will be described. In the following examples, it is demonstrated that, in comparison with photoelectric conversion elements not having any mixed layer in the photoelectric conversion layer, the photoelectric conversion element containing a mixed layer of a p-type organic semiconductor and a fullerene can provide a more sufficient external quantum effect with suppressing dark current.

EXAMPLE 1

A 25-mm square glass substrate equipped with an ITO electrode is subjected to ultrasonic cleaning with successive, acetone, Semico Clean, and isopropyl alcohol (IPA), each for 15 minutes. After finally washing with boiling IPA, UV/O$_3$ washing is carried out. The substrate is then transferred into an organic vacuum evaporation chamber, and the pressure inside the chamber is reduced to a level of $1\times10^{-4}$ Pa or less. Subsequently, while rotating the substrate holder, m-MT-DATA is vacuum-evaporated on the ITO electrode as a first charge-blocking layer at a vacuum evaporation rate of 0.5 to 1 Å/sec to a thickness of 1,000 Å according to the resistance-heating method. Next, as a p-type organic semiconductor of the photoelectric conversion layer, silicon 2,3-naphthalocyanine bis(trihexylsilyloxide) (bought from Sigma-Aldrich Japan K.K. and purified by sublimation) is vacuum-evaporated at a constant rate of 3.0 Å/sec, while vacuum-evaporating an n-type organic semiconductor of fullerene C60 (bought from Sigma-Aldrich Japan K.K. and purified by sublimation) at a constant vacuum evaporation rate of 15.0 Å/sec, 12.0 Å/sec, 9.0 Å/sec, 6.0 Å/sec, 3.0 Å/sec, 1.5 Å/sec, 1.0 Å/sec, 0.75 Å/sec, 0.6 Å/sec, 0.5 Å/sec, 0.45 Å/sec, 0.38 Å/sec, 0.33 Å/sec, or 0.30 Å/sec to thereby conduct coevaporation with keeping the mixing ratio of the p-type organic semiconductor to fullerene C60 at 1:5, 1:4, 1:3, 1:2, 1:1, 2:1, 3:1, 4:1, 5:1, 6:1, 7:1, 8:1, 9:1, or 10:1 in terms of thickness ratio, thus a photoelectric conversion layer in which the p-type organic semiconductor and fullerene C60 are mixed with each other with a total thickness of 500 Å being formed. Subsequently, sublimation-purified Alq$^3$ is vacuum-evaporated thereon at a vacuum evaporation rate of from 1 to 2 Å/sec to form a second charge-blocking layer of 300 Å in thickness.

Next, this substrate is transferred to a metal vacuum evaporation chamber while keeping in-vacuum. Aluminum is vacuum-evaporated on the second charge-blocking layer as an opposing electrode to a thickness of 1000 Å while keeping the pressure within the chamber at $1\times10^{-4}$ Pa or less. Also, the area of photoelectric conversion region formed by the lower-most ITO electrode and the aluminum opposing electrode is adjusted to 2 mm×2 mm. This substrate is transferred to a globe box in which respective concentrations of moisture and oxygen are kept at 1 ppm or less, without exposing to the atmosphere, and its sealing with glass to which a moisture absorbent is applied is carried out using a UV-curable resin.

Figure 6:
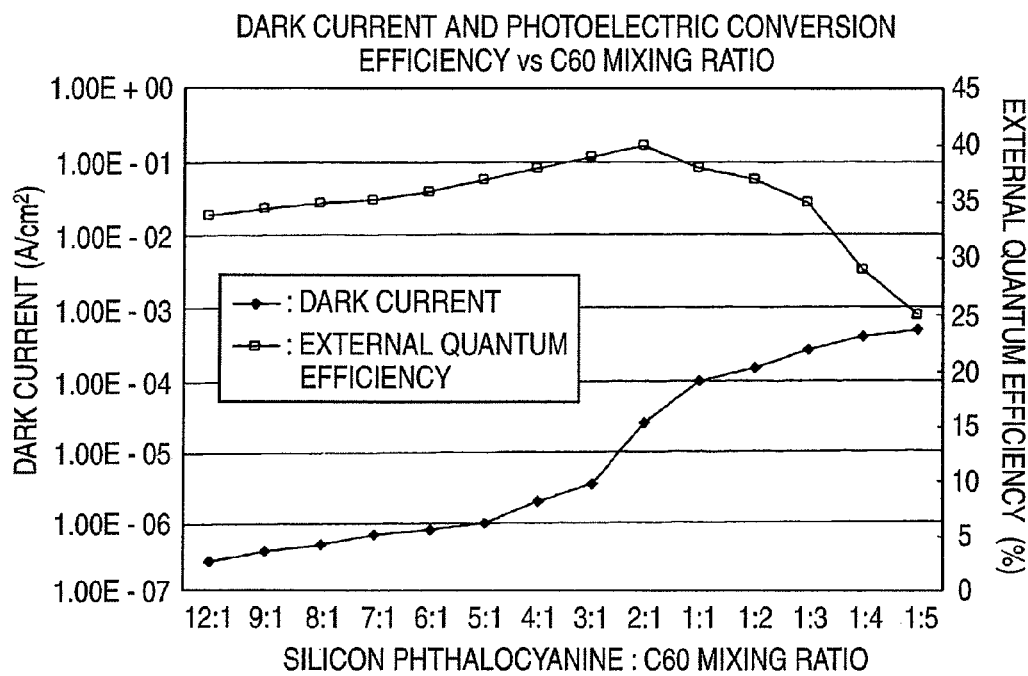
FIG. 6 is a graph showing values of dark current flowing at a time of no light irradiation and external quantum efficiency versus the mixing ratios in the photoelectric conversion layer of the photoelectric conversion element in Example 1.
Figure 7:
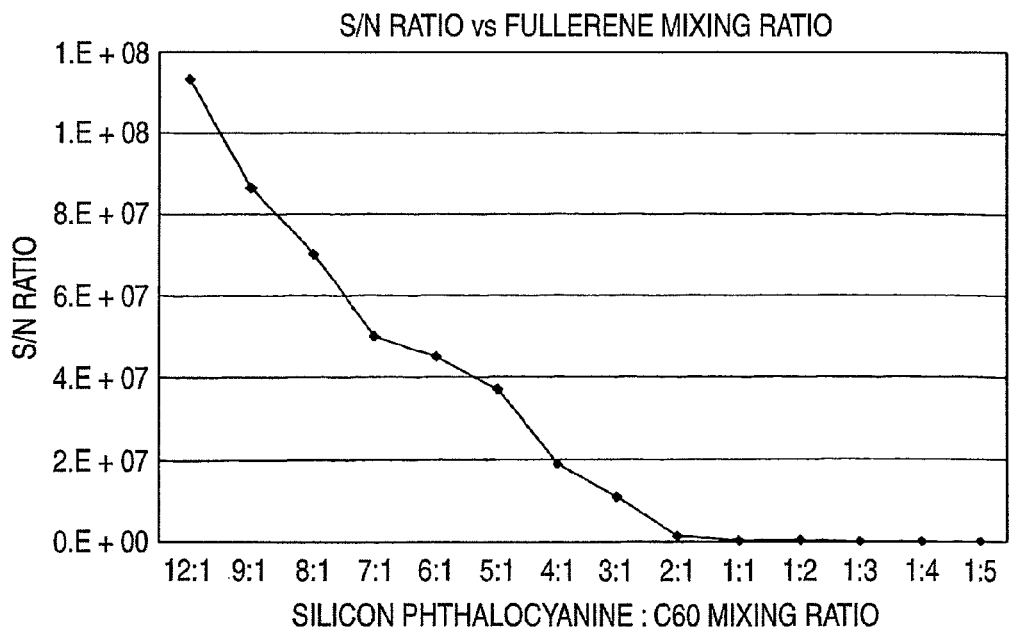
FIG. 7 is a graph showing S/N ratios versus the mixing ratios in the photoelectric conversion layer of the photoelectric conversion element prepared in Example 1.

A value of dark current flow at the time of no light irradiation and a value of a light current flowing at the time of light irradiation, when an external electric field of $1.0 \times 10^6$ V/cm$^2$ is applied to this element, are measured, as is shown in FIG. 6, using an energy quantum efficiency measuring apparatus manufactured by Optel (Cathley 6430 being used as the source meter), and external quantum efficiency of the element is calculated from these values. Light irradiation is carried out to the area of 1.5 mmϕ of the 2 mm×2 mm photoelectric conversion region. The amount of irradiated light is adjusted to 50 µW/cm$^2$. Also, the value obtained by dividing the external quantum efficiency obtained at the time of light irradiation by the dark current density obtained at the time of no light irradiation is determined as S/N ratio with each mixing ratio. The results thus obtained are shown in FIG. 7.

EXAMPLE 2

Figure 8:
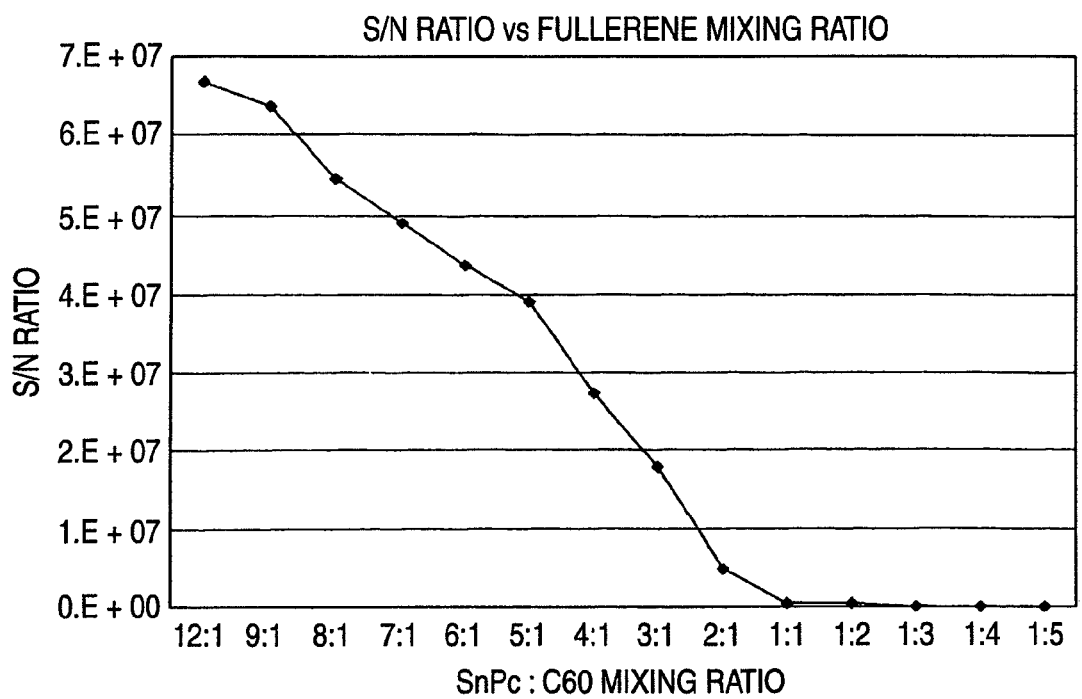
FIG. 8 is a graph showing S/N ratios versus the mixing ratios in the photoelectric conversion layer of the photoelectric conversion element prepared in Example 2.

An element is prepared under the same conditions as in Example 1 except for using, as the p-type organic semiconductor, tin phthalocyanine (SnPc) (bought from Sigma-Aldrich Japan K.K. and purified by sublimation) in place of silicon 2,3-naphthalocyanine bis(trihexylsilyloxide), and the S/N ratios are determined. The results are shown in FIG. 8.

EXAMPLE 3

Figure 9:
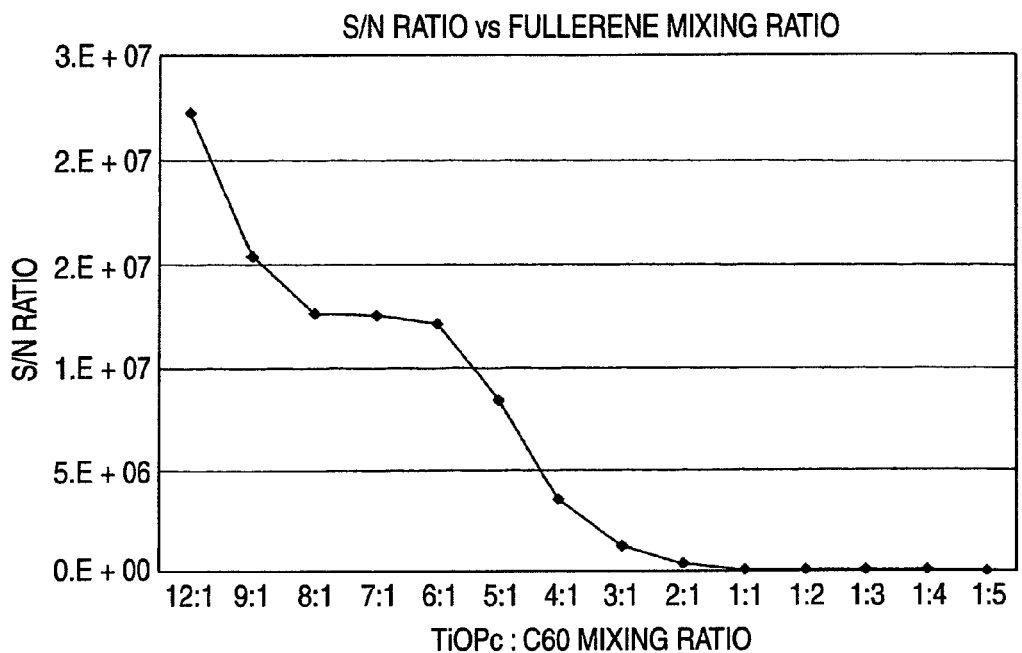
FIG. 9 is a graph showing S/N ratios versus the mixing ratios in the photoelectric conversion layer of the photoelectric conversion element prepared in Example 3.

An element is prepared under the same conditions as in Example 1 except for using, as the p-type organic semiconductor, titanyl phthalocyanine (TiOPc) (bought from Sigma-Aldrich Japan K.K. and purified by sublimation) in place of silicon 2,3-naphthalocyanine bis(trihexylsilyloxide), and the S/N ratios are determined. The results are shown in FIG. 9.

EXAMPLE 4

Figure 10:
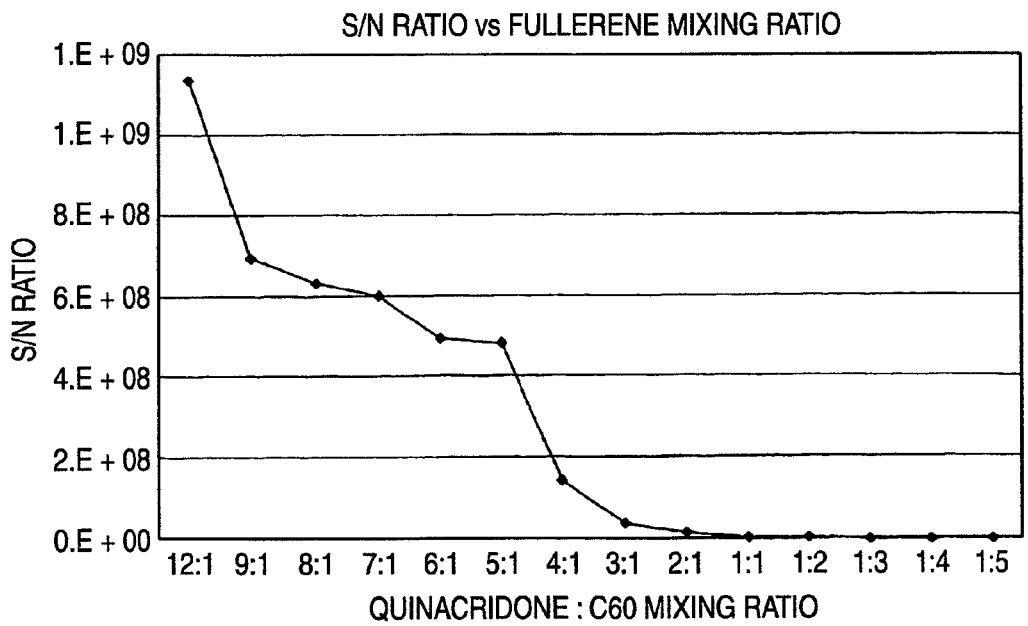
FIG. 10 is a graph showing S/N ratios versus the mixing ratios in the photoelectric conversion layer of the photoelectric conversion element prepared in Example 4.

An element is prepared under the same conditions as in Example 1 except for using, as the p-type organic semiconductor, quinacridone (bought from Sigma-Aldrich Japan K.K. and purified by sublimation) in place of silicon 2,3-naphthalocyanine bis(trihexylsilyloxide), and the S/N ratios are determined. The results are shown in FIG. 10. Also, absorption spectrum of the vacuum-evaporated film is measured with respect to the cases where the ratios of quinacridone to fullerene C60 are 1:1 and 4:1. Additionally, regarding absorption spectrum, measurement is conducted with respect to only the photoelectric conversion layer vacuum-evaporated on quartz, using a spectrophotometer, U-3310 manufactured by Hitachi Ltd.

EXAMPLE 5

Figure 11:
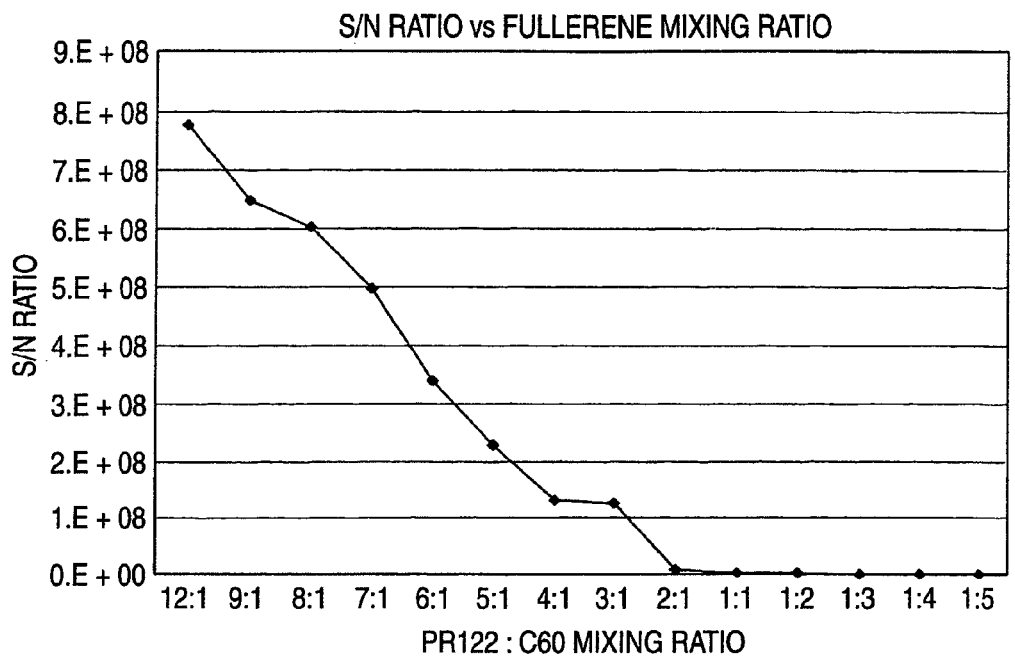
FIG. 11 is a graph showing S/N ratios versus the mixing ratios in the photoelectric conversion layer of the photoelectric conversion element prepared in Example 5.

An element is prepared under the same conditions as in Example 1 except for using, as the p-type organic semiconductor, PR-122 (2,9-dimethyl-quinacridone) (bought from Sigma-Aldrich Japan K.K. and purified by sublimation) in place of silicon 2,3-naphthalocyanine bis(trihexylsilyloxide), and the S/N ratios are determined. The results are shown in FIG. 11.

EXAMPLE 6

Figure 12:
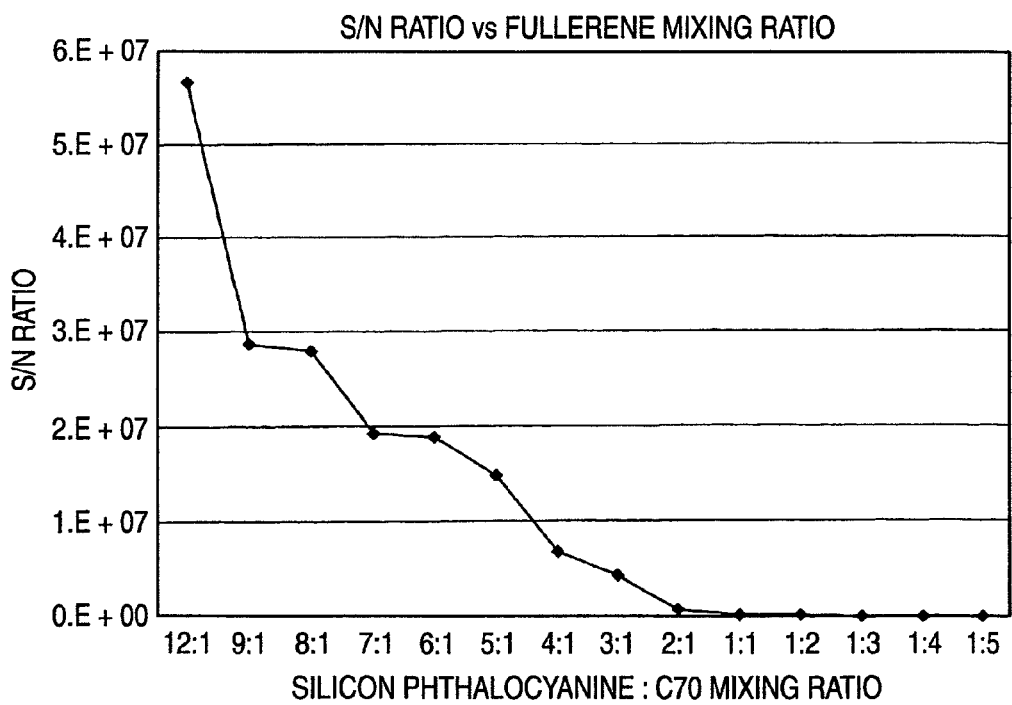
FIG. 12 is a graph showing S/N ratios versus the mixing ratios in the photoelectric conversion layer of the photoelectric conversion element prepared in Example 6.

An element is prepared under the same conditions as in Example 1 except for using, as the n-type organic semiconductor, fullerene C70 (bought from Sigma-Aldrich Japan K.K. and purified by sublimation) in place of fullerene C60, and the S/N ratios are determined. The results are shown in FIG. 12.

The results of Examples 1 to 5 reveal that, with respect to the mixing ratio of fullerene C60 to the p-type organic semiconductor in terms of film thickness ratio, S/N is improved when the ratio of fullerene to the p-type organic semiconductor is reduced to less than 1:1, more improved when the ratio of the p-type organic semiconductor:fullerene is reduced to less than 2:1 (proportion of fullerene being reduced), and a larger S/N is obtained when the ratio of the p-type organic semiconductor:fullerene is reduced to less than 4:1 (proportion of fullerene being reduced). In particular, it has been found that, when the mixing ratio of the p-type organic semiconductor:fullerene C60 is reduced to less than 4:1 (proportion of fullerene being reduced), the dark current can be reduced. This is attributed to the fact that the degree of reduction of dark current caused by reducing the ratio of fullerene is remarkably larger than the degree of reduction of external quantum efficiency caused by reducing the ratio of fullerene, which eventually serves to provide a large S/N ratio. As the optimal mixing ratio of fullerene, a mixing ratio at which the efficiency becomes highest in the range where the dark current is at an acceptable degree as an image pick-up device can be selected. However, when the mixing ratio of fullerene is too small, there results insufficient external quantum efficiency though the dark current is reduced, and hence the mixing ratio of fullerene (e.g., fullerene C60) to the p-type organic semiconductor in terms of thickness ratio is preferably from less than 1:1 to about 1:10.

Also, with fullerene C60 having an absorption spectrum in the entire visible light region, when the mixing ratio of fullerene C60 to quinacridone in terms of thickness ratio is adjusted to 1:1, there results a strong absorption of, particularly, blue light and a little absorption of red light. On the other hand, when the ratio of quinacridone:fullerene is adjusted to 4:1, there results almost no absorption of blue light and red light, thus only green light being able to be absorbed. In the case where sharp spectrally transmitting properties are required as with a stacked-type organic imaging device, broadening of the absorption spectrum due to a high fullerene ratio leads to fatal defects. However, The S/N ratio can be improved with keeping the sharp absorption, by adjusting the mixing ratio of fullerene to the organic semiconductor in terms of thickness ratio to less than 1:1.

What is claimed is:

1. A method of driving a photoelectric conversion element, the photoelectric conversion element comprising
    a photoelectric conversion portion which includes a pair of electrodes and a photoelectric conversion layer between the pair of electrodes, wherein at least part of the photoelectric conversion layer includes a mixed layer of a p-type organic semiconductor and a fullerene, and a mixing ratio of the fullerene to the p-type organic semiconductor in terms of thickness ratio is equal to or less than one-third;
    a semiconductor substrate above which at least one photoelectric conversion portion is stacked;
    a charge accumulating portion disposed in the semiconductor substrate and accumulating a charge generated in the photoelectric conversion layer of the photoelectric conversion portion;
    a connecting portion that electrically connects one of the pair of electrodes of the photoelectric conversion portion, the one of the pair of electrodes being for collecting the charge to the charge accumulating portion, and
    an intra-substrate photoelectric conversion portion disposed in the semiconductor substrate, wherein the intra-substrate photoelectric conversion portion absorbs light transmitted through the photoelectric conversion layer of the photoelectric conversion portion and generating and accumulating a charge in proportion to an amount of the light, the method comprising applying a voltage across the pair of electrodes in which a value obtained by dividing the voltage by the distance between the pair of electrodes is from $1.0 \times 10^5$ V/cm to $1.0 \times 10^7$ V/cm.

2. The method of driving a photoelectric conversion element according to claim 1, wherein the photoelectric conversion portion further includes a first charge-blocking layer between one of the pair of electrodes and the photoelectric conversion layer, the first charge-blocking layer suppressing injection of a charge from the one of the pair of electrodes into the photoelectric conversion layer upon applying a voltage across the pair of electrodes.

3. The method of driving a photoelectric conversion element according to claim 2, wherein the photoelectric conversion portion further includes a second charge-blocking layer between the other of the pair of electrodes and the photoelectric conversion layer, the second charge-blocking layer suppressing injection of a charge from the other of the pair of electrodes into the photoelectric conversion layer upon applying a voltage across the pair of electrodes.

4. The method of driving a photoelectric conversion element according to claim 1, wherein the fullerene is one of fullerene C60 and fullerene C70.

5. The method of driving a photoelectric conversion element according to claim 1, wherein the p-type organic semiconductor is a phthalocyanine.

6. The method of driving a photoelectric conversion element according to claim 1, wherein the p-type organic semiconductor is a naphthalocyanine.

7. The method of driving a photoelectric conversion element according to claim 1, wherein the p-type organic semiconductor is a quinacridone.

8. The method of driving a photoelectric conversion element according to claim 1, wherein the intra-substrate photoelectric conversion portion comprises a plurality of photodiodes stacked in the semiconductor substrate and capable of absorbing light having different colors.

9. The method of driving a photoelectric conversion element according to claim 8, wherein the plurality of photodiodes are arranged in a direction perpendicular to an incident direction of the light.

10. The method of driving a photoelectric conversion element according to claim 9, wherein the number of photoelectric conversion portions stacked above the semiconductor substrate is one, the plurality of photodiodes includes a photodiode absorbing light in a blue wavelength region and a photodiode absorbing light in a red wavelength region, and the photoelectric conversion layer of the photoelectric conversion portion absorbs light in a green wavelength region.

11. The method of driving a photoelectric conversion element according to claim 1, wherein a photoelectric conversion material of the at least one photoelectric conversion portion is an organic semiconductor having a maximum peak of an absorption spectrum thereof in a near-infrared region.

12. The method of driving a photoelectric conversion element according to claim 11, wherein the photoelectric conversion material is transparent to light in a visible region.

13. The method of driving a photoelectric conversion element according to claim 12, wherein the photoelectric conversion material is SnPc or a silicon naphthalocyanine.

14. The method of driving a photoelectric conversion element according to claim 1, wherein the mixing ratio of the fullerene to the p-type organic semiconductor in terms of thickness ratio is from 1:10 to 1:3.

15. The method of driving a photoelectric conversion element according to claim 1, wherein the distance between the pair of electrodes is from 30 to 600 nm.

16. The method of driving a photoelectric conversion element according to claim 1, wherein the distance between the pair of electrodes is from 70 to 500 nm.

17. A solid-state imaging device comprising:

a plurality of photoelectric conversion elements driven by the method of driving a photoelectric conversion element according to claim 1 in an array form; and a signal read-out portion that reads out a signal corresponding to a charge accumulated in a charge accumulating portion in each of the plurality of photoelectric conversion elements.

18. A solid-state imaging device comprising:

a semiconductor substrate;

a plurality of photoelectric conversion elements driven by the method of driving a photoelectric conversion element according to claim 1 in an array form above the semiconductor substrate;

a color filter layer disposed above the semiconductor substrate and transmitting light in a wavelength region different from that absorbed by the photoelectric conversion layer;

an intra-substrate photoelectric conversion element disposed in the semiconductor substrate and below the photoelectric conversion layer and absorbing the light having transmitted through the color filter layer and the photoelectric conversion layer to generate a charge in proportion to the light; and a signal read-out portion that reads out a signal generated in the intra-substrate photoelectric conversion layer and a signal corresponding to a charge generated in the photoelectric conversion element.

19. The solid-state imaging device according to claim 18, wherein the color filter is disposed above the photoelectric conversion layer.

20. The solid state imaging device according to claim 19, wherein the color filter layer includes a plurality of color filters corresponding to the respective photoelectric conversion elements, and the plurality of color filters are classified into a plurality of kinds of color filters transmitting light of different wavelength regions.

* * * * *